US008093585B2

(12) United States Patent
Nishimura et al.

(10) Patent No.: US 8,093,585 B2
(45) Date of Patent: Jan. 10, 2012

(54) ORGANIC ELECTRO-LUMINESCENT DISPLAY APPARATUS

(75) Inventors: Etsuko Nishimura, Hitachiota (JP); Masatoshi Wakagi, Hitachinaka (JP); Kenichi Onisawa, Hitachinaka (JP); Mieko Matsumura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 670 days.

(21) Appl. No.: 12/275,414

(22) Filed: Nov. 21, 2008

(65) Prior Publication Data
US 2009/0146930 A1 Jun. 11, 2009

(30) Foreign Application Priority Data
Nov. 22, 2007 (JP) .................. 2007-302757

(51) Int. Cl.
H01L 29/08 (2006.01)
H01L 35/24 (2006.01)
H01L 51/00 (2006.01)

(52) U.S. Cl. ... 257/40; 257/347; 257/359; 257/E29.117; 257/E29.137; 257/E51.005; 257/E51.006; 257/E29.151; 438/99; 438/149

(58) Field of Classification Search ............ 257/40, 257/359, 347, E29.117, E29.137, E51.005, 257/E51.006, E29.151; 438/99, 149, FOR. 135, 438/FOR. 201; 445/60
See application file for complete search history.

(56) References Cited

U.S. PATENT DOCUMENTS
7,279,715 B2 * 10/2007 Park et al. ................. 257/79
7,314,785 B2 * 1/2008 Yamazaki et al. ............ 438/149
7,442,991 B2 * 10/2008 Yamazaki et al. ............ 257/344
2002/0149018 A1 * 10/2002 Hirata ........................... 257/72

FOREIGN PATENT DOCUMENTS
JP 10-189252 7/1998
JP 2007-035963 2/2007

OTHER PUBLICATIONS
Hanna, "Reactive Thermal CVD for Low-Temperature Growth of Polycrystalline Silicon Thin Films and their Application to Thin Films Transistors", J. Vac. Soc. Jpn., vol. 47, No. 9, pp. 702-711, Jun. 2004.

* cited by examiner

Primary Examiner — Michelle Estrada
(74) Attorney, Agent, or Firm — Antonelli, Terry, Stout & Kraus, LLP.

(57) ABSTRACT

Each TFT for driving each of a plurality of pixels arranged in a matrix-like configuration is configured using a stagger-type polycrystalline-Si TFT. A gate electrode, which is composed of a high-heat-resistant material capable of resisting high temperature at the time of polycrystalline-Si film formation, is disposed at a lower layer as compared with the polycrystalline-Si layer that forms a channel of each TFT. A gate line, which is composed of a low-resistance material, is disposed at an upper layer as compared with the polycrystalline-Si layer. The gate electrode and the gate line are connected to each other via a through-hole bored in a gate insulation film. Respective configuration components of each organic electro-luminescent element are partially co-used at the time of the line formation, thereby suppressing an increase in the steps, processes, and configuration components.

20 Claims, 27 Drawing Sheets

ORGANIC ELECTRO-LUMINESCENT DISPLAY APPARATUS

BACKGROUND OF THE INVENTION

1. Field of the Invention

The present invention relates to an organic electro-luminescent display apparatus. More particularly, it is preferable for an organic electro-luminescent display apparatus provided with a polycrystalline-Si TFT structure having excellent characteristics.

2. Description of the Related Art

In accompaniment with the arrival of full-fledged multimedia age, attention has been focused on organic electro-luminescent display apparatus as a next-generation flat-plane-type display apparatus which are expected to replace the conventional liquid-crystal display apparatus. The organic electro-luminescent display apparatus exhibits excellent characteristics such as spontaneous light, wide field-of-view angle, and high-speed response characteristics. In the so-called bottom-emission-type organic electro-luminescent display apparatus, which is one type of the organic electro-luminescent display apparatuses, a large number of organic electro-luminescent elements are arranged in a matrix-like configuration on an insulation substrate the representative of which is a glass substrate (which, hereinafter, will be referred to as "glass substrate"). Here, each organic electro-luminescent element is configured in such a manner that a transparent lower electrode such as ITO, an organic layer including hole transport layer, electro-luminescent layer, and electron transport layer, and a low-work-function upper electrode (i.e., reflection electrode) are formed in this sequence. Moreover, when an about a-few-volts voltage is applied between the lower electrode and the upper electrode, holes and electrons are injected into the upper electrode and the lower electrode respectively. Then, each hole and each electron are recombined with each other within the electro-luminescent layer via the transport layers, thereby resulting in generation of an exciton. This exciton emits light when it returns to the ground state. Furthermore, this emitted light passes through the lower electrode having transparent property, then being extracted from the rear surface side of the substrate.

Also, in the so-called top-emission-type organic electro-luminescent display apparatus, which is another type of the organic electro-luminescent display apparatus, a large number of organic electro-luminescent elements are arranged in a matrix-like configuration on the glass substrate. Here, each organic electro-luminescent element is configured in such a manner that, contrary to the above-described bottom-emission-type display apparatus, a low-work-function lower electrode (i.e., reflection electrode), the organic layer including hole transport layer, electro-luminescent layer, and electron transport layer, and a transparent upper electrode such as ITO are formed in this sequence. Emitted light generated within the electro-luminescent layer is extracted after passing through the upper electrode which is positioned on the opposite side to the glass substrate.

The organic electro-luminescent display apparatus, where the organic electro-luminescent elements are used as the pixels, are classified into the simple-matrix type and the active-matrix type, depending on driving schemes for the pixels. In the simple-matrix-type organic electro-luminescent display apparatus, the organic layers, each of which includes the hole transport layer, the electro-luminescent layer, and the electron transport layer, are formed at positions at which a plurality of anode lines and a plurality of cathode lines intersect with each other. Each pixel is lit up only within a selected time during a one-frame time-period. This selected time becomes equal to time width calculated by dividing the one-frame time-period by the number of the anode lines. The simple-matrix-type organic electro-luminescent display apparatus possesses an advantage that its structure is simple. In the simple-matrix-type display apparatus, however, the selected time becomes shorter as the number of the pixels becomes larger. Accordingly, it becomes necessary that the average luminance during the one-frame time-period be made equal to a predetermined value by increasing driving voltage and thereby increasing the instantaneous luminance during the selected time. On account of this necessity, life time of each organic electro-luminescent element becomes shorter. Also, since each organic electro-luminescent element is driven by current, a voltage drop due to line resistance occurs in the case of, in particular, a large screen. Consequently, applying the voltage to each pixel uniformly becomes difficult, and as a result, a luminance variation occurs within the display apparatus. On account of the drawbacks described above, there exists a limit to the high-definition and large-screen implementation of the simple-matrix-type organic electro-luminescent display apparatus.

Meanwhile, in the active-matrix-type organic electro-luminescent display apparatus, each of driving elements, which are configured with switching elements including a plurality of thin film transistors (TFTs) and a plurality of capacitors, is connected to each organic electro-luminescent element which configures each pixel. This configuration allows each pixel to be lit up during the entire one-frame time-period. On account of this configuration, there is no need of the necessity for increasing the luminance. This makes it possible to enhance the life time of each organic electro-luminescent element. Accordingly, it is considered that the active-matrix-type organic electro-luminescent display apparatus is advantageous for the high-definition and large-screen implementation of the display apparatus. Each TFT for driving each organic electro-luminescent element is requested to exhibit characteristics that mobility is high and that a threshold-value (Vth) shift is small. Usually, the coplanar-type polycrystalline-Si TFT where polycrystalline Si having excellent-characteristics is applied to the semiconductor layer is used instead of the stagger-type amorphous-Si TFT used in the liquid-crystal display apparatus and the like.

SUMMARY OF THE INVENTION

In the case of the coplanar-type polycrystalline-Si TFT structure where the polycrystalline Si is used, when compared with the stagger-type TFT, ensuring the characteristics is easier. The necessary processing-step number, however, increases as the structure becomes complicated. Also, specific processes such as selective doping of impurity into the channel junction portion and specific fabrication facilities become necessary for the fabrication of the coplanar-type polycrystalline-Si TFT structure. Accordingly, the fabrication becomes significantly disadvantageous from the cost-based viewpoint. The process temperature necessary for steps such as impurity activation processing is high as well. If the stagger-type polycrystalline-Si TFT structure can be implemented, it will be exactly desirable from the cost-based viewpoint. For the practical implementation of the stagger-type polycrystalline-Si TFT structure, however, there exist the following problems to be solved.

In the stagger-type TFT, the structure becomes a one where, in principle, either of gate electrode of the TFT or source/drain electrode thereof is disposed in a lower layer as compared with the semiconductor layer that forms the channel. Specifically, if the stagger-type TFT is of the inverted-stagger-type TFT structure, the gate electrode is disposed in the lower layer as compared with the semiconductor layer. Meanwhile, if the stagger-type TFT is of the regular-stagger-type TFT structure, the source/drain electrode is disposed in the lower layer as compared with the semiconductor layer. Usually, formation of the polycrystalline-Si film requires a high-temperature film formation step or high-temperature heat treatment step at about 600° C., i.e., a temperature higher than the thermal decomposition temperature of a raw-material gas. Accordingly, it turns out that these electrodes disposed in the lower layer as compared with the semiconductor layer are exposed to the high-temperature process at the time of the polycrystalline-Si formation. Consequently, heat damage to the electrodes and lines has been unavoidable.

In this patent specification, explanation will be given such that a position distant from the insulation substrate such as a glass substrate is referred to as "upper layer", and a position close to the insulation substrate is referred to as "lower layer". This means that, e.g., the upper layer for the semiconductor layer is positioned on the opposite side to the insulation substrate with respect to the semiconductor layer, and that the lower layer is positioned on the side of the insulation substrate. Incidentally, in some cases, the upper layer and the lower layer are referred to as "the upper" and "the lower", respectively.

Accordingly, the electrodes and lines disposed in the lower layer are also required to exhibit a heat-resistant property with respect to short-circuit or disconnection of a line due to occurrence of hillock or void accompanied by the heat treatment and contact failure due to the heat diffusion. Consequently, there have existed limits to the line material and the structure, e.g., a high-melting-point metallic material must be used instead of the usually-used low-resistance metals such as Al and Cu. Thick-film implementation of the line allows the low-resistance implementation thereof. It is difficult, however, to control normal taper machining for the thick-film line. Also, in a large step-difference portion made to occur by the thick-film line, ensuring the step coverage of an interlayer insulation film disposed in the upper layer becomes difficult. These difficulties have become the causes for the short-circuit at a lines-intersection portion or the disconnection failure of a line disposed in a more upper layer. Accordingly, there have also existed the limits to the thickening of the film thickness of the lines. These limits require that a signal delay due to the line resistance be taken into consideration. In particular, there has existed the limit to the large-sized implementation of the display.

As a method for forming the polycrystalline-Si film at a low temperature, e.g., the plasma CVD method has been proposed. In the plasma CVD method, a gas such as hydrogen ($H_2$)-diluted $SiH_4$ or $SiF_4$ is used as a raw-material gas. The raw-material gas, however, is activated in the plasma vapor phase, thereby giving rise to a promotion of crystalline-nuclei formation and simultaneously, an increase in the crystalline-nuclei density. Consequently, it is difficult in principle to implement the compatibility between enhancement in the crystalline property and enlargement in the crystalline-particle size. As a result, the excellent-quality polycrystalline-Si film is difficult to obtain. Also, since a initial layer having an amorphous tissue is likely to deposit, the crystalline property becomes more degraded as the film becomes thinner. In the case of using the inverted-stagger-type TFT structure where the channel is configured on the substrate side, the above-described drawbacks have become particularly serious problems.

In trying to address the above-described problems inevitably accompanied by the plasma CVD method, the thermal CVD method (which, hereinafter, will be referred to as "reaction-heat CVD method") has been proposed. In the reaction-heat CVD method, a hydrogen-containing compound and a halogen-containing compound are used. This method uses, e.g., the hydrogen-extracting reaction of extracting hydrogen from a silane compound by using fluorine (F) within germanium halide contained in the raw-material gas. This hydrogen-extracting reaction makes it possible to promote the formation of the polycrystalline-Si film at a low temperature which is lower as compared with the thermal decomposition temperature of the raw-material gas. Also, the reaction-heat CVD method allows the raw-material gas to be effectively activated only on the substrate surface without activating the gas in the vapor phase. This feature makes it possible to form the nuclei directly on a large area. Moreover, the method allows the formed nuclei to be grown to the crystalline particle, thereby making it possible to obtain the excellent-quality polycrystalline-Si film at the low temperature (Refer to J. Vac. Soc. Jpn. (vacuum), Vol. 47, No. 9, pp. 702-711 (2004)). Even in the case of taking advantage of the above-described low-temperature formation process, however, the formation of the polycrystalline-Si film still requires a high temperature of 450° C. or higher. As a result, it has been difficult from the heat-resistant viewpoint to use the low-resistance metals such as aluminum (Al) and copper (Cu) as the line material.

As a method for forming the high-quality polycrystalline-Si film at low temperature, the following method has been proposed: Namely, in this method, laser annealing is used and applied. First, the line portion is formed into a clad multilayered line structure of electrodes composed of a high-heat-resistant metal and a main line portion composed of the low-resistance metal. The heat damage to the lines is avoided by executing the selective illumination with laser light in such a manner that the laser illumination is avoided in the main line portion (Refer to JP-A-2007-35963). In this case, however, there exists a limit to the area which can be crystallized at one time by the laser illumination. Accordingly, it is difficult to form the polycrystalline-Si film on a large area uniformly. As a result, there also exists a limit to the large-sized implementation of the display. Also, the laser annealing step is newly needed, and a more times of patterning steps by photolithography than usual needs to be performed for the formation of the multilayered line structure. Consequently, the process cost becomes higher.

Meanwhile, in the bottom-emission-type organic electro-luminescent display apparatus where emitted light is extracted from the rear surface side of the substrate, the active-matrix driving is performed by providing each driving unit between the substrate and each organic electro-luminescent element. At this time, the aperture ratio is limited by each TFT and the line portion. In particular, in the case of a large-sized display, the low-resistance implementation of a power-supply line is also absolutely necessary. This is absolutely necessary in order to reduce the luminance variation between the pixels due to a voltage drop of the power-supply line. When trying to ensure the low resistance by broadening the line width, the aperture ratio becomes smaller by just that amount.

In contrast thereto, there exists an attempt of configuring the so-called top-emission-type organic electro-luminescent display apparatus. In the top-emission-type organic electro-luminescent display apparatus, the reflection film is provided on the lower-electrode side, and the upper electrode is made transparent, then performing extraction of emitted light from the upper-electrode side. In this type of organic electro-luminescent display apparatus, an interlayer insulation film for implementing pixel planarization can be provided on each TFT, capacitor, and line. Then, an organic electro-luminescent element unit can be formed on the interlayer insulation film. This feature makes it possible to enlarge the aperture unit by just that amount (Refer to JP-A-10-189252). However, the new configuration components, such as the reflection film and the interlayer insulation film for the planarization, become necessary. Accordingly, the structure and processes become complicated by the amount equivalent thereto.

It is an object of the present invention to provide, without increasing the necessary steps and processes, an organic electro-luminescent display apparatus which is capable of implementing compatibility between the stagger-type polycrystalline-Si TFT structure having excellent characteristics and the low-resistance line structure advantageous for the large-sized implementation of the display, and which is advantageous from the cost-based viewpoint as well as the performance-based viewpoint.

In order to accomplish the above-described object, in the present invention, the following configuration is given: Namely, an organic electro-luminescent display apparatus of the present invention includes a plurality of pixels arranged in a matrix-like configuration, having a structure including TFTs for driving the pixels, and organic electro-luminescent elements each configuring each of the pixels, wherein an organic electro-luminescent layer is sandwiched between an upper electrode and a lower electrode. Moreover, each of the TFTs is configured with an inverted-stagger-type TFT where a gate electrode, a gate insulation film, a semiconductor layer, and source/drain electrodes are disposed in this sequence on an insulation substrate, the gate electrode being disposed at a lower layer as compared with the semiconductor layer, the semiconductor layer forming a channel of each of the TFTs, a gate line being disposed at an upper layer as compared with the semiconductor layer, the gate line being composed of a material that is different from a material of which the gate electrode is composed, the gate electrode and the gate line being connected to each other via a through-hole which is bored in the insulation film.

Also, when each of the TFTs is configured with a regular-stagger-type TFT, the following configuration is given to the organic electro-luminescent display apparatus of the present invention: The source/drain electrodes are disposed at the lower layer as compared with the semiconductor layer, the semiconductor layer forming the channel of each of the TFTs, the drain line being disposed at a upper layer as compared with the semiconductor layer, the drain line being composed of a material that is different from a material of which the drain electrode is composed, the drain electrode and the drain line being connected to each other via a through-hole which is bored in the insulation film.

The application of the above-described configurations allows a following configuration: Namely, even in the case where the polycrystalline-Si film which necessitates the high-temperature formation is applied to the semiconductor layer of the stagger-type TFTs, the TFT electrodes disposed at the lower layer as compared with the semiconductor layer can be formed by using a high-heat-resistant material which is capable of resisting the high temperature at the time of the polycrystalline-Si film formation. Simultaneously, independent of this employment of the high-heat-resistant material as the TFT electrodes, the wiring lines, which are disposed at a upper layer as compared with the semiconductor layer, and which are not exposed to the high temperature at the time of the polycrystalline-Si film formation, can be formed by using a low-resistance material.

In the above-described configurations, in the case of the inverted-stagger-type TFT, the source/drain electrodes and the drain line are disposed at the upper layer as compared with the semiconductor layer. The gate line disposed at the upper layer as compared with the semiconductor layer is disposed at a more upper layer as compared with the source/drain electrodes and the drain line via an interlayer insulation film. Meanwhile, in the case of the regular-stagger-type TFT, the gate electrode and the gate line are disposed at the upper layer as compared with the semiconductor layer. The drain line disposed at the upper layer as compared with the semiconductor layer is disposed at a more upper layer as compared with the gate electrode and the gate line via the interlayer insulation film.

According to the present invention, it becomes possible to provide the organic electro-luminescent display apparatus which is capable of implementing the compatibility between the stagger-type polycrystalline-Si TFT structure having excellent characteristics and the low-resistance line structure advantageous for the large-sized implementation of the display, which is advantageous from the cost-based viewpoint as well as the performance-based viewpoint. Also, the wiring lines disposed at the upper layer as compared with the semiconductor layer, and the insulation film provided at the upper layer of the wiring lines are partially co-used with the respective configuration components of each organic electro-luminescent element such as the electrodes, the line, and the insulation film. This partial co-use makes it possible to suppress an increase in the steps, processes, and configuration components, thereby making it possible to provide the organic electro-luminescent display apparatus which is further advantageous from the cost-based viewpoint.

Other objects, features and advantages of the invention will become apparent from the following description of the embodiments of the invention taken in conjunction with the accompanying drawings.

DETAILED DESCRIPTION OF THE INVENTION

Figure 1:
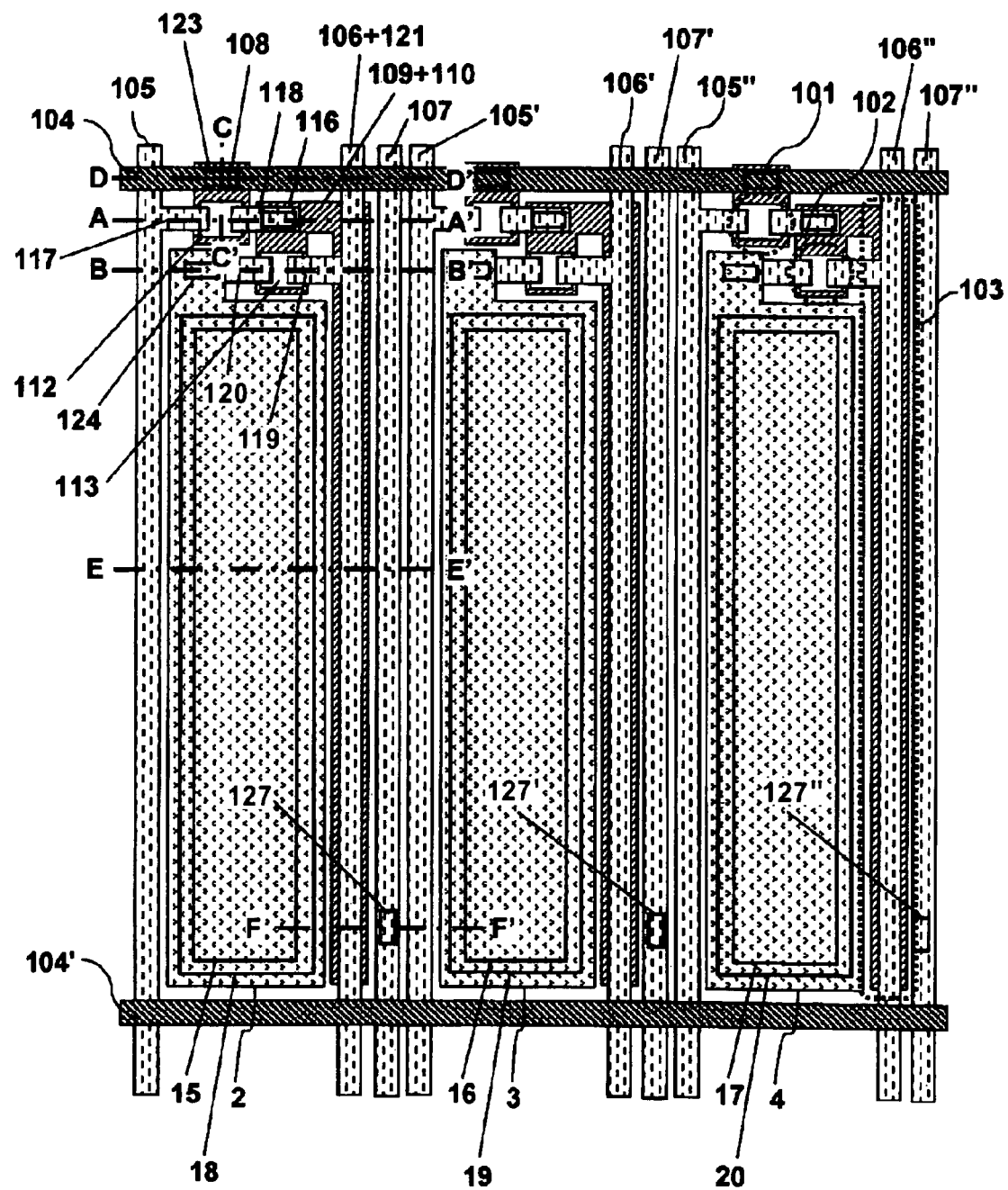
FIG. 1 is a plane view of one color pixel of an organic electro-luminescent display apparatus according to a first embodiment of the present invention.

When carrying out the above-described organic electro-luminescent display apparatus, the following elements can be added: The surfaces of the wiring lines disposed at the upper layer as compared with the semiconductor layer (i.e., the gate line in the case of the inverted-stagger-type TFT; whereas the drain line in the case of the regular-stagger-type TFT) are required to be coated with an insulation film provided at the more upper layer as compared with the wiring lines, except for the terminal portion which becomes a connection portion with an external circuit. The following configuration, however, may also be employable: The insulation film is co-used with the interlayer insulation film provided under each organic electro-luminescent element for implementing the pixel planarization, or with a bank insulation layer provided for separating the electro-luminescent portions of the organic electro-luminescent elements on each pixel basis. The insulation film disposed at the upper layer is co-used with the insulation-film configuration components of each organic electro-luminescent element. This co-use makes it possible to suppress an increase in the steps, processes, and configuration components.

The wiring lines disposed at the upper layer as compared with the semiconductor layer (i.e., the gate line in the case of the inverted-stagger-type TFT; whereas the drain line in the case of the regular-stagger-type TFT) can also be configured with the same layer and the same component as the lower electrode of each organic electro-luminescent element, or with the same layer and the same component as the reflection film provided under the lower electrode of each organic electro-luminescent element, or with the same layer and the same component as an auxiliary line connected to the upper electrode of each organic electro-luminescent element. The wiring lines disposed at the upper layer are co-used with the electrode and line configuration components of each organic electro-luminescent element. This co-use makes it possible to suppress an increase in the steps, processes, and configuration components.

In the above-described configurations, the through-hole for establishing the connection between the electrodes disposed at the lower layer as compared with the semiconductor layer (i.e., the gate electrode in the case of the inverted-stagger-type TFT; whereas the source/drain electrodes in the case of the regular-stagger-type TFT), and the wiring lines disposed at the upper layer as compared with the semiconductor layer (i.e., the gate line in the case of the inverted-stagger-type TFT; whereas the drain line in the case of the regular-stagger-type TFT) is so configured as to be bored in a multilayered film of at least the gate insulation film of each TFT and the interlayer insulation film.

Also, with respect to the film thickness of the electrodes disposed at the lower layer as compared with the semiconductor layer (i.e., the gate electrode in the case of the inverted-stagger-type TFT; whereas the source/drain electrodes in the case of the regular-stagger-type TFT), it becomes possible to make this film thickness thinner than the film thickness of the lines disposed at the upper layer as compared with the semiconductor layer. With respect to the electrodes disposed at the lower layer as compared with the semiconductor layer, matrix-like wiring is required for the gate line and the drain line becomes unnecessary. As a result, lowering the resistance based on the thick-film formation becomes unnecessary. Accordingly, the arbitrary thinning of the film thickness is made possible as it becomes unnecessary to take the line resistance into consideration. Desirably, the film thickness can be set in a range from 20 nm to 100 nm. More desirably, the film thickness can be set in a range from 20 nm to 50 nm.

This feature makes it possible to reduce the thermal tension that becomes a cause of the generation of hillock or void accompanied by the heat treatment, thereby allowing an enhancement in the heat-resistant property of the electrodes disposed at the lower layer as compared with the semiconductor layer. Also, the step-difference generated by the electrode patterns disposed at the lower layer as compared with the semiconductor layer can be made small. This feature makes it possible to ensure the step coverage of the insulation film and wiring lines to be formed on the electrodes, i.e., specifically, the gate insulation film, the semiconductor layer, and further, the gate line and the drain line of each TFT, thereby allowing a suppression of the short-circuit or disconnection caused by the step-difference. The thinning of the film thickness also makes it easy to ensure configuration of the normal taper machining for the electrode patterns themselves disposed at the lower layer. On account of this feature, taking the step coverage into consideration also becomes unnecessary for the gate insulation film and the semiconductor layer to be formed on the electrodes. As a result, the thinning of the film thickness becomes possible by just that amount. Accordingly, it also becomes possible to achieve an enhancement in the characteristics such as reduction in the threshold-value voltage or off current. Desirably, the film thickness of the gate insulation film can be set in a range from 100 nm to 300 nm. More desirably, the film thickness can be set in a range from 100 nm to 200 nm.

The materials employable as the electrodes disposed at the lower layer as compared with the semiconductor layer are as follows: A high-melting-point metal such as Mo, Ti, Ta, W, Nb, or Cr, or an alloy of these metals, or a multilayered film of these metals, or an Al alloy containing at least one of Si, Cu, Pd, Ni, Ta, Ti, Zr, Hf, Sc, Y, Ce, and Nd, or a transparent electrically-conductive oxide film such as ITO, IZO, IGO, ITZO, IGZO, ZnO, AZO, or GZO. Employing these components as the electrode material makes it easy to ensure the heat-resistant property against the high-temperature process at the time of the polycrystalline-Si film formation.

With respect to the wiring lines disposed at the upper layer as compared with the semiconductor layer, ensuring the heat-resistant property becomes unnecessary. As a result, a low-resistance metal such as Al, Cu, or Ag, or an alloy of these metals, or a multilayered film containing these metals becomes employable. This feature makes it easy to ensure the low-resistance gate line and drain line.

With respect to the semiconductor layer, taking the heat damage to the wiring lines into consideration becomes unnecessary. This feature makes it possible to use the polycrystalline films of Si or SiGe which is required to be formed at high-temperature. This allows acquisition of a stagger-type TFTs having excellent characteristics, which can exhibit a high mobility and a small threshold-value (Vth) shift, and which is necessary for driving each organic electro-luminescent element. For example, a polycrystalline film, which is formed using the reaction-heat CVD method where a hydrogen-containing compound and a halogen-containing compound are used, is employable as the semiconductor layer. By forming the stagger-type TFT on the insulation substrate such as glass substrate, it becomes possible to provide the organic electro-luminescent display apparatus which is advantageous from the cost-based viewpoint as well as the performance-based viewpoint. Also, the use of the stagger-type TFTs allows a peripheral circuit to be mounted on the organic electro-luminescent display apparatus.

The organic electro-luminescent display apparatus according to the present invention refers to the active-matrix-type organic electro-luminescent display apparatus, where each pixel is equipped with each of driving elements. In the active-matrix-type organic electro-luminescent display apparatus, each of the driving elements, which are configured with switching elements including two or a plurality of thin film transistors (TFTs) and a plurality of capacitors, is connected to each organic electro-luminescent element which configures each pixel. This configuration allows each pixel to be lit up during the entire one-frame time-period.

What is referred to as "pixels" here refers to a plurality of minimum units which are arranged transversely and longitudinally on the display apparatus, and which displays characters and graphics on a display region of the display apparatus. For displaying in color, each pixel is configured to be further divided into three-color subpixels of green, red, and blue. The display region refers to a region where an image is to be displayed on the display apparatus. Such layers as protection layer and color conversion layer including a color filter layer are formed as required on each organic electro-luminescent element which becomes each pixel portion. After that, the organic electro-luminescent display apparatus is formed through a panel sealing step.

In the present invention, hereinafter, what is referred to as "each organic electro-luminescent element" refers to an element equipped with the following structure: Namely, each organic electro-luminescent element is configured with substrate/lower electrode/first injection layer/first transport layer/electro-luminescent layer/second transport layer/second injection layer/upper electrode/protection layer or sealing substrate (i.e., opposed substrate).

A two-way combination exists for the lower electrode and the upper electrode. First combination is a configuration where the lower electrode is an anode, and where the upper electrode is a cathode. In this case, the first injection layer and the first transport layer become a hole injection layer and a hole transport layer, respectively. Also, the second transport layer and the second injection layer become an electron transport layer and an electron injection layer, respectively. The other combination is a configuration where the lower electrode is the cathode and the upper electrode is the anode. In this case, the first injection layer and the first transport layer become the electron injection layer and the electron transport layer, respectively. Also, the second transport layer and the second injection layer become the hole transport layer and the hole injection layer, respectively. In the above-described configurations, a configuration where the first injection layer or the second injection layer does not exist is also conceivable. Also, a configuration where the first transport layer or the second transport layer is doubled by the electro-luminescent layer is conceivable.

In the lower electrode and the upper electrode, a combination is desirable where one electrode has a transmission property to emitted light, and where the other electrode has reflection property to the emitted light. In this case, in order to extract the emitted light from the electrode having transmission property, this electrode is referred to as "light-extracting electrode". Meanwhile, the electrode having reflection property is referred to as "light-reflecting electrode". The light-reflecting electrode can also be configured with a combination of a reflection film and the electrode having transmission property. The case where the upper electrode becomes the light-extracting electrode corresponds to the above-described the top-emission-type structure. Meanwhile, the case where lower electrode becomes the light-extracting electrode corresponds to the above-described bottom-emission-type structure.

The component which is desirable as what is referred to as "anode" here is a large-work-function electrically-conductive film that allows an enhancement in the hole injection efficiency. Specifically, gold and platinum can be cited, but it is not limited to these materials. For example, by providing the hole injection layer which will be described later, it becomes unnecessary to employ the large-work-function materials, and thus it becomes possible to employ the ordinary electrically-conductive film. Specifically, a metal such as aluminum, indium, molybdenum, or nickel, or an alloy using these metals, or an inorganic material such as polysilicon, amorphous silicon, tin oxide, zinc oxide, indium oxide, or indium tin oxide (ITO), or an organic material such as polyaniline or polythiophene by the coating method which is a simple formation process, or an electrically-conductive ink can be employable.

When the anode is used as the transparent electrode, a transparent electrically-conductive film is employable which is composed of a binary system such as indium tin oxide (ITO), indium zinc oxide (IZO), or indium germanium oxide (IGO), or a ternary system such as indium tin zinc oxide (ITZO). In the case of ITO, the composition used often is a one where 5 to 10 wt. % tin oxide is contained with respect to indium oxide. Also, in addition to indium oxide, the composition whose main component is tin oxide or zinc oxide is allowable. The manufacturing methods that can be cited for manufacturing the transparent electrically-conductive film are such as the sputtering method, EB vaporization method, and ion plating method. Although the transmission ratio becomes somewhat smaller, a metallic extremely-thin film is also employable as the transparent electrode. When the anode is used as the reflection electrode, a multilayered-film structure is also employable where the transparent electrically-conductive film is formed on the reflection film composed of a metal. Desirably, each layer is composed of each of the above-described materials. Also, of course, the material for each layer is not limited to these materials. Also, it is allowable to simultaneously use the two kinds or more materials out of these materials.

The component which is desirable as what is referred to as "cathode" here is a small-work-function electrically-conductive film that allows an enhancement in the electron injection efficiency. Although, specifically, magnesium-silver alloy, aluminum-lithium alloy, aluminum-calcium alloy, aluminum-magnesium alloy, or metallic calcium can be cited as the materials for the component, the component is not limited to these materials. By providing the electron injection layer which will be described later, it becomes unnecessary to employ the small-work-function materials as the condition for the cathode, and thus it becomes possible to employ the ordinary metallic materials. Specifically, the materials which are employable as the cathode material are a metal such as aluminum, indium, molybdenum, or nickel, or an alloy using these metals, or an inorganic material such as polysilicon or amorphous silicon.

The material which is desirable as what is referred to as "hole injection layer" here is a material that has a suitable ionization potential for lowering the injection barrier of the anode and the hole transport layer. It is desirable that the hole injection layer also plays a role of filling in surface projections and depressions on the underlying layer. Specifically, copper phthalocyanine, star-burst amine compound, polyaniline, polythiophene, vanadium oxide, molybdenum oxide, ruthenium oxide, or aluminum oxide can be cited as the material, but the component is not limited to these materials.

The component which is desirable as what is referred to as "hole transport layer" here is a component that plays a role of transporting the holes and injecting them into the electro-luminescent layer. On account of this, it is desirable that the hole transport layer is composed of a material having hole transportation property and a high hole mobility. Also, it is desirable that the material is chemically stable, and that the material has a small ionization potential. Also, it is desirable that the material has a small electron affinity, and that the material has a high glass transition temperature.

The specific materials which are desirable as the hole transport layer are as follows: N,N'-bis(3-methylphenyl)-N,N',N'-diphenyl-[1,1'-biphenyl]-4, 4' diamine (TPD), 4,4'-bis[N-(1-naphthyl)-N-phenylamino]biphenyl (α-NPD), 4,4',4"-tri (N-carbazolyl) triphenylamine (TCTA), 1,3,5-tris [N-(4-diphenylaminophenyl) phenylamino] benzene (p-DPA-TDAB), 4,4',4"-tris (N-carbazole) triphenylamine (TCTA), 1, 3,5-tris [N,N-bis(2-methylphenyl)-amino]-benzene (o-MTDAB), 1,3,5-tris [N,N-bis(3-methylphenyl)-amino]-benzene (m-MTDAB), 1,3,5-tris [N,N-bis(4-methylphenyl)-amino]-benzene (p-MTDAB), 4,4',4"-tris [1-naphthyl (phenyl) amino] triphenylamine (1-TNATA), 4,4',4"-tris [2-naphthyl (phenyl) amino]triphenylamine (2-TNATA), 4,4',4"-tris [biphenyl-4-il-(3-methylphenyl) amino] triphenylamine (p-PMTDATA), 4,4',4"-tris [9,9-dimethylfluorine-2-il (phenyl) amino] triphenylamine (TFATA), 4,4',4"-tri (N-carbazolyl) triphenylamine (TCTA), 1,3,5-tris [N-(4-diphenylaminophenyl) phenylamino] benzene (p-DPA-TDAB), 1,3,5-tris {4-[methylphenyl (phenyl) amino] phenyl}benzene (MTDAPB), N,N'-di (biphenyl-4-il)-N,N'-diphenyl [1,1'-biphenyl]-4,4' diamine (p-BPD), N,N'-bis (9,9-dimethylfluorene-2-il)-N,N'-diphenylfluorene-2,7-diamine (PFFA), N,N,N',N'-tetrakis (9,9-dimethylfluorene-2-il)-[1,1'-biphenyl]-4,4'diamine (FFD), (NDA) PP, 4,4'-bis[N, N'-(3-tryl) amino]-3-3'-dimethylphenyl (HMTPD). Of course, the material for the hole transport layer is not limited to these materials. Also, it is allowable to simultaneously use the two kinds or more materials out of these materials.

What is referred to as "electro-luminescent layer" here refers to a layer in which each injected hole and each injected electron recombine with each other, thereby emitting light whose wavelength is specific to the material. This phenomenon of emitting the light is classified into the following two cases: A case where the host material, which forms the electro-luminescent layer itself, emits the light, and a case where a dopant material doped into the host material in minute quantity emits the light. The specific desirable host materials are as follows: Distyreylallylene derivative (DPVBi), silole derivative having benzene ring in its framework (2PSP), oxodiazole derivative (EM2) having triphenylamine structure at both ends, perylene derivative (P1) having phenanthrene group, oligothiophene derivative (BMA-3T) having triphenylamine structure at both ends, perylene derivative (tBu-PTC) tris (8-quinolinol) aluminum, polyparaphenylenevinylene derivative, polythiophene derivative, polyparaphenylene derivative, polysilane derivative, and polyacetylene derivative. Of course, the desirable host materials are not limited to these materials. Also, it is allowable to simultaneously use the two kinds or more materials out of these materials.

The specific desirable dopant materials are as follows: Quinacridon, coumarin 6, nile red, rubrene, 4-(dicyanomethylene)-2-methyl-6-(para-dimethylaminostyreyl)-4H-pyrane (DCM), dicarbazole derivative, porphyrin platinum complex (PtOEP), and iridium complex (Ir (ppy) 3). Of course, the desirable dopant materials are not limited to these materials. Also, it is allowable to simultaneously use the two kinds or more materials out of these materials.

What is referred to as "electron transport layer" here is a component that plays a role of transporting the electrons and injecting them into the electro-luminescent layer. On account of this, it is desirable that the electron transport layer is composed of a material having electron transportation-property and high electron mobility. The specific materials desirable as the electron transport layer are as follows: Tris (8-quinolinol) aluminum, oxodiazole derivative, silole derivative, zinc benzothiazole complex, and basocyuproine (BCP). Of course, the desirable materials are not limited to these materials. Also, it is allowable to simultaneously use the two kinds or more materials out of these materials.

What is referred to as "electron injection layer" here is used in order to enhance the electron injection efficiency from the cathode into the electron transport layer. The specific materials desirable as the electron injection layer are as follows: Lithium fluoride, magnesium fluoride, calcium fluoride, strontium fluoride, barium fluoride, magnesium oxide, and aluminum oxide. Of course, the desirable materials are not limited to these materials. Also, it is allowable to simultaneously use the two kinds or more materials out of these materials.

What is referred to as "protection layer"here is formed on the upper electrode in order to prevent atmospheric $H_2O$ and $O_2$ from sneaking into the upper electrode, or the organic layer under the upper electrode. The specific materials desirable as the protection layer are as follows: An inorganic material such as $SiO_2$, $SiN_x$, or $Al_2O_3$, or an organic material such as polychloropiren, polyethylene terephthalate, polyoxymethylene, polyvinyl chloride, polyvinylidene fluoride, cyanoethylprurane, polymethylmethacrylate, polysulfone, polycarbonate, or polyimide. The desirable materials, however, are not limited to these materials.

The material which is desirable as what is referred to as "substrate" here can be selected from a wide range, as long as it is an insulation-property material. The specific materials employable as the substrate are as follows: An inorganic material such as glass or alumina sintered body, or each type of insulation-property plastic such as polyimide film, polyester film, polyethylene film, polyphenylrenthlufide film, or polyparaxylene film. Furthermore, as long as the insulation-property material is formed on the surface of the substrate, the employment of a metallic material gives rise to no problem. Specifically, stainless, aluminum, copper, or an alloy containing these metals can be mentioned, but the metallic material is not limited to these materials.

Hereinafter, based on embodiments referring to drawings, the explanation will be given below concerning the embodiments of the organic electro-luminescent display apparatus according to the present invention.

Figure 14:
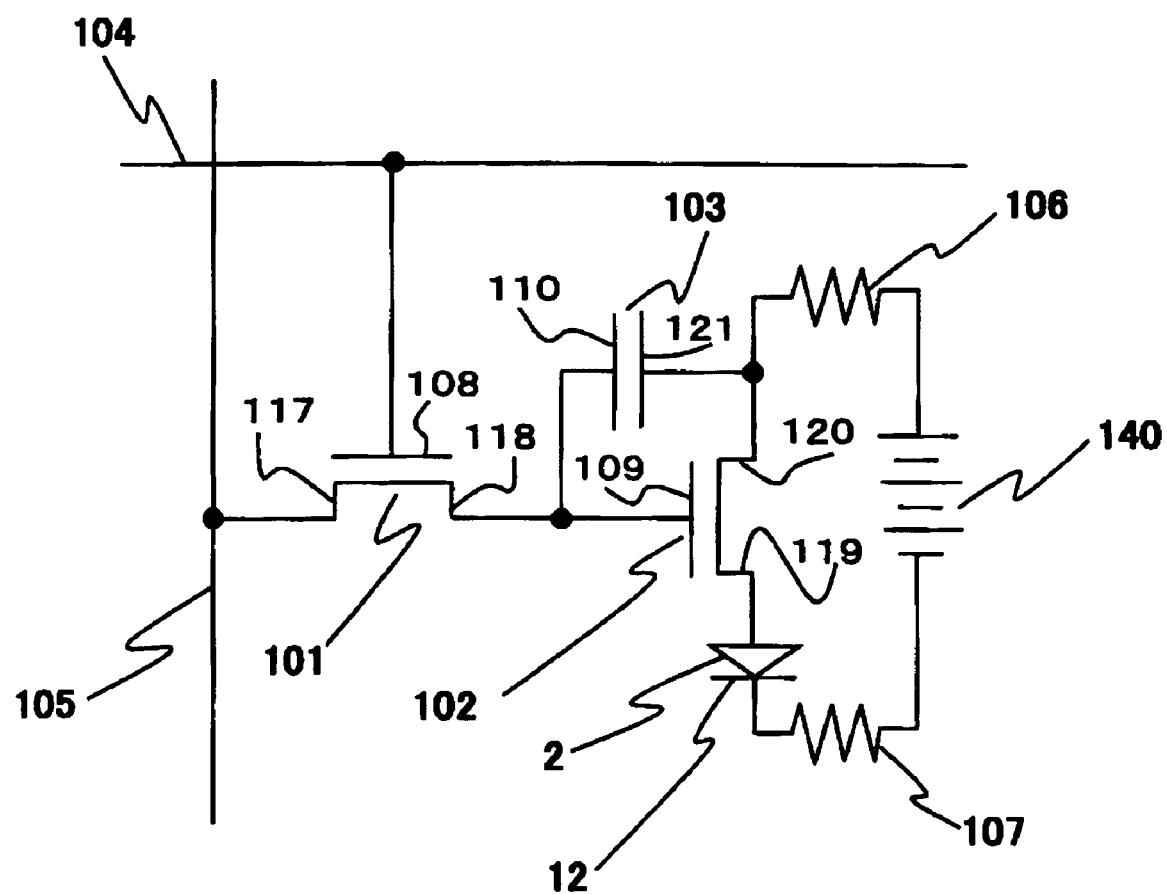
FIG. 14 is a circuit diagram for explaining an example of the one color pixel of the organic electro-luminescent display apparatus according to the present invention.

FIG. 14 is a circuit diagram for explaining an example of one color pixel of an organic electro-luminescent display apparatus according to the present invention. This circuit diagram illustrates an example of a basic circuit configuration where a first transistor 101, a second transistor 102, and a capacitor 103 are provided as a driving element. A gate electrode 108 of the first transistor 101 is connected to a gate line 104, which is a scanning line of the organic electro-luminescent display apparatus. In a specific transistor, source/drain electrodes will be explained as a source electrode and a drain electrode. A source electrode 117 of the first transistor 101 is connected to a drain line 105, which is a signal line of the organic electro-luminescent display apparatus. A drain electrode 118 of the first transistor 101 is connected to a gate electrode 109 of the second transistor 102 and a lower electrode 110 of the capacitor 103. A drain electrode 120 of the second transistor 102 is connected to an upper electrode 121 of the capacitor 103 and a first current supply line (denoted by a line resistor) 106. A source electrode 119 of the second transistor 102 is connected to a lower electrode 2 of each organic electro-luminescent element. The current supply line is a line for connecting each organic electro-luminescent element with an external power-supply 140. The first current supply line 106 connects the external power-supply 140 with the lower electrode 2 of each organic electro-luminescent element via the source electrode 119 and the drain electrode 120. Next, a second current supply line (denoted by a line resistor) 107 is an auxiliary line for connecting the external power-supply 140 with an upper electrode 12 of each organic electro-luminescent element, which becomes a common electrode to each pixel. If the upper electrode 12 has a sufficient low resistance, the auxiliary line 107 can be omitted by using the upper electrode 12 as the second current supply line just as it is.

In the following embodiments, the explanation will be given below based on the example of the circuit configuration indicated in FIG. 14. The present invention, however, is not limited to this circuit configuration. The present invention is applicable to whatever driving circuit, as long as it is a driving circuit whose configuration elements are the thin film transistors (TFTs).

Embodiment 1

Figure 2A:
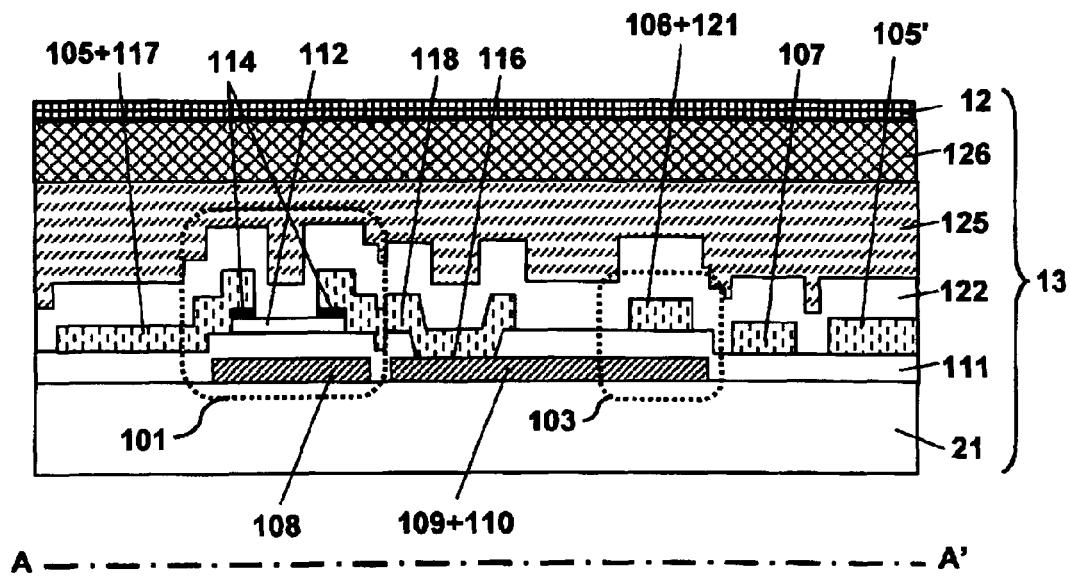
FIG. 2A is a cross-sectional view of the apparatus along the A-A' line in FIG. 1.
Figure 2B:
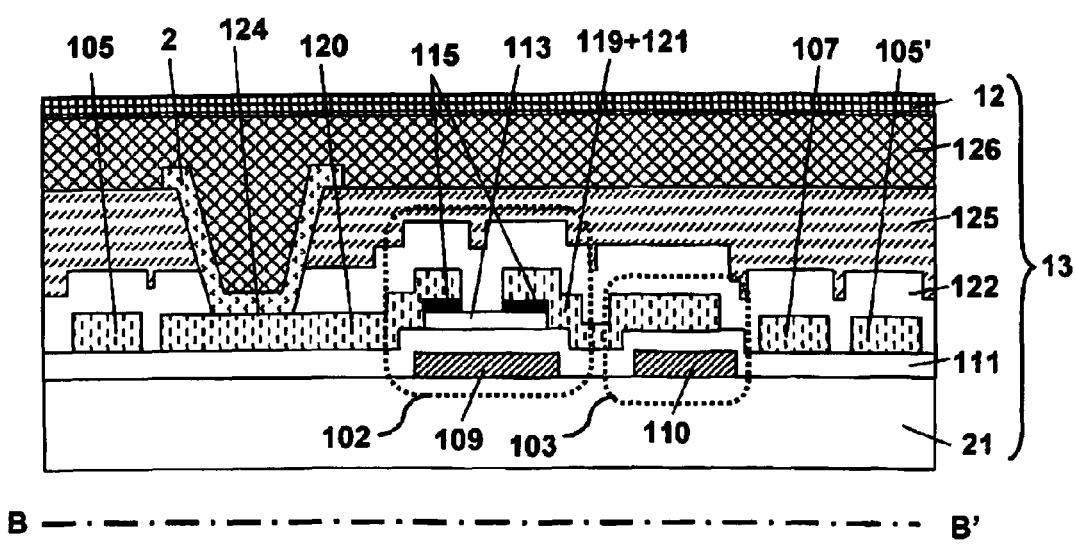
FIG. 2B is a cross-sectional view of the apparatus along the B-B' line in FIG. 1.
Figure 2C:
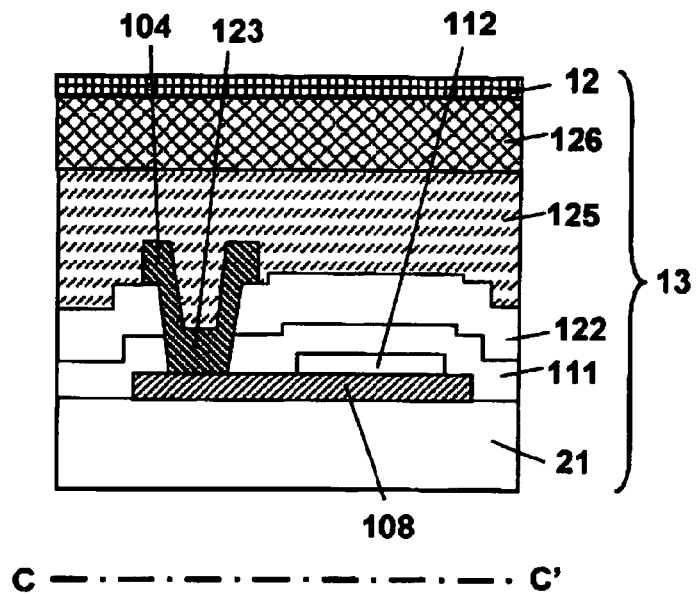
FIG. 2C is a cross-sectional view of the apparatus along the C-C' line in FIG. 1.
Figure 2D:
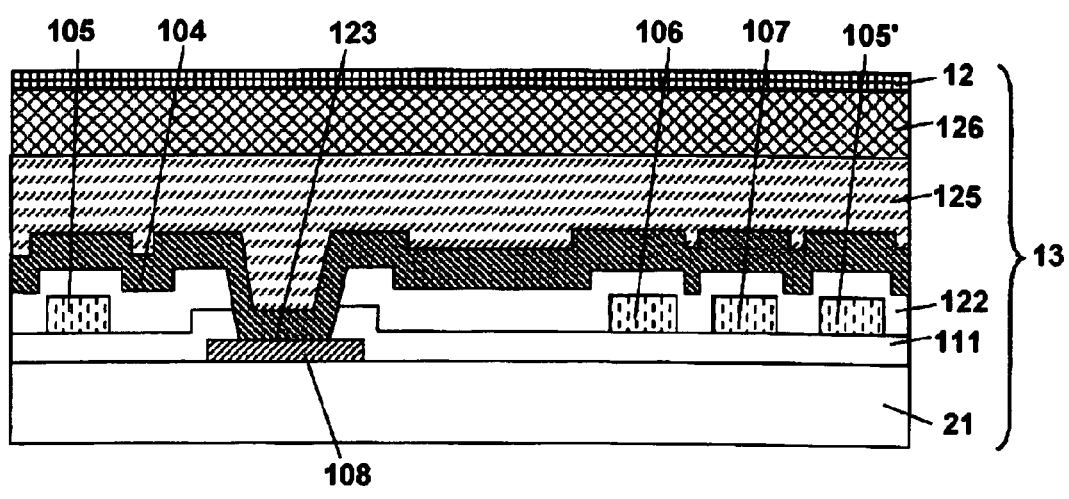
FIG. 2D is a cross-sectional view of the apparatus along the D-D' line in FIG. 1.
Figure 2E:
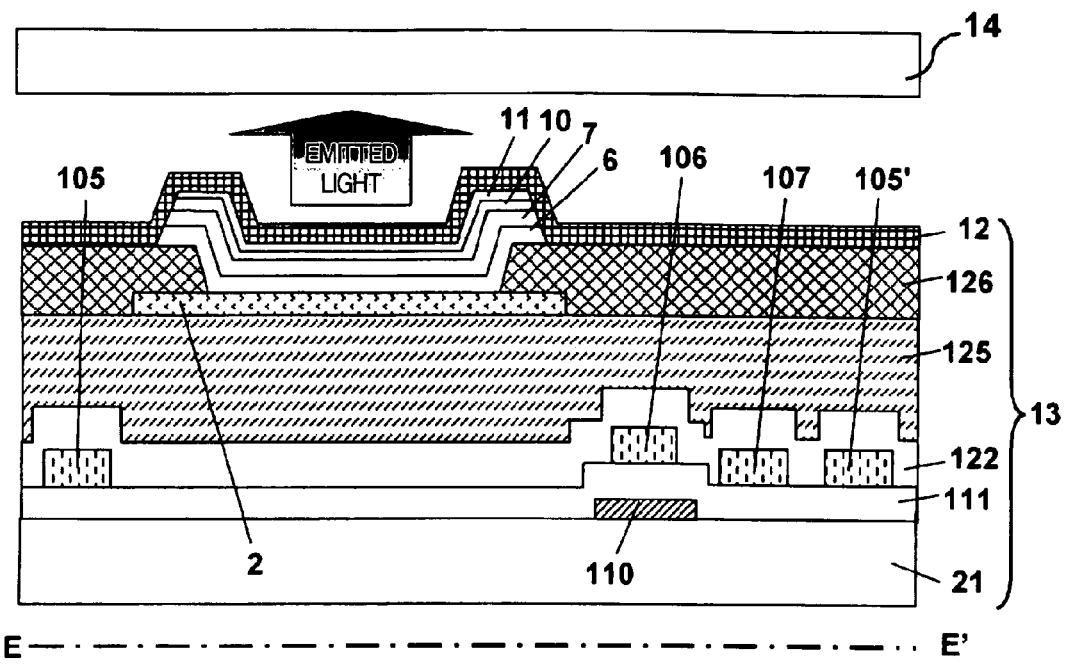
FIG. 2E is a cross-sectional view of the apparatus along an E-E' line in FIG. 1.
Figure 2F:
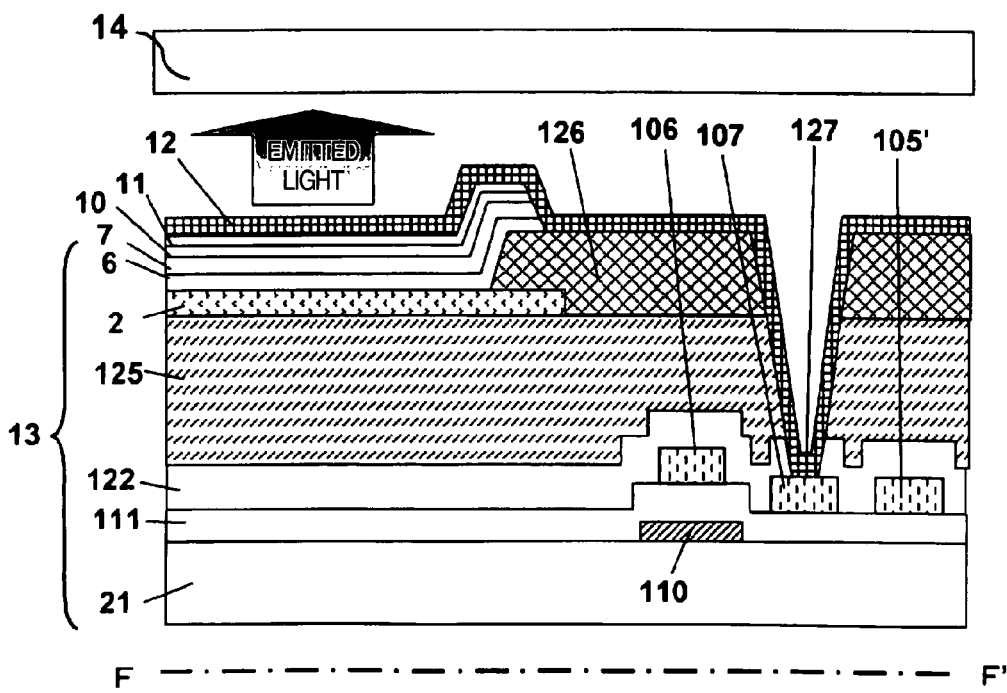
FIG. 2F is a cross-sectional view of the apparatus along the F-F' line in FIG. 1.

FIG. 1 is a plane view of one color pixel of an organic electro-luminescent display apparatus according to a first embodiment of the present invention. Here, one color pixel was configured with three-primary-color subpixels of green, red, and blue. Also, FIG. 2A is a cross-sectional view of the apparatus along an A-A' line in FIG. 1. FIG. 2B is a cross-sectional view of the apparatus along a B-B' line in FIG. 1 similarly. FIG. 2C is a cross-sectional view of the apparatus along a C-C' line in FIG. 1 similarly. FIG. 2D is a cross-sectional view of the apparatus along a D-D' line in FIG. 1 similarly. FIG. 2E is a cross-sectional view of the apparatus along an E-E'line in FIG. 1 similarly. FIG. 2F is a cross-sectional view of the apparatus along an F-F' line in FIG. 1 similarly.

In FIG. 1 and FIG. 2A to FIG. 2F, on a glass substrate 21, a plurality of scanning lines 104 were arranged with a constant spacing placed therebetween. Simultaneously, a plurality of signal lines 105 for transferring image information were arranged with a constant spacing placed therebetween in the direction intersecting each scanning line 104. Namely, each scanning line 104 and each signal line 105 were arranged in a lattice-like configuration. The region surrounded by each scanning line 104 and each signal line 105 becomes a display region equivalent to one pixel or one subpixel. Moreover, a plurality of first current supply lines 106 connected to the power-supply, and a plurality of auxiliary lines 107 for the upper electrode 12 of each organic electro-luminescent element, which become the plurality of second current supply lines 107, were disposed in parallel to each signal line 105.

As illustrated in FIG. 1 and FIG. 2A to FIG. 2F, the plurality of organic electro-luminescent elements, which configure the pixels that become minimum units of a color image, were disposed on the upper side of each line layer. Each organic electro-luminescent element was configured with, as each subpixel, an organic layer including the hole injection layer 5, the hole transport layer 6, electro-luminescent layers 7, 8, and 9, emitting each-color R, G, and B, the electron transport layer 10, and the electron injection layer 11, the lower electrodes 2, 3, and 4 which sandwich the organic layer therebetween, and the upper transparent electrode 12. The respective subpixels are separated by a bank insulation film 126 which is a third interlayer insulation film. Aperture portions 14, 15, and 16 of the bank insulation film 126 become pixel aperture portions. The lower electrodes 2, 3, and 4 of each organic electro-luminescent element belonging to each pixel was connected to the first current supply line 106 via the transistors as the driving element. The upper transparent electrode 12 of each organic electro-luminescent element belonging to each pixel was connected to the second current supply line 107 connected to the power-supply.

Also, as illustrated in FIG. 1, FIG. 2A, and FIG. 2B, in each subpixel, the first transistor 101, the second transistor 102, and the capacitor 103 were formed as the driving element for driving the organic layer of each pixel. The first transistor 101 was configured with a gate electrode 108 formed on the glass substrate 21, a gate insulation film 111, a semiconductor layer 112, a dope layer 114, and the source electrode 117 and the drain electrodes 118. The second transistor 102 was configured with the gate electrode 109 formed on the glass substrate 21, the gate insulation film 111, a semiconductor layer 113, a dope layer 115, and the source electrode 119 and the drain electrodes 120.

In the present embodiment, the inverted-stagger-type TFT structure was employed as the first transistor 101 and the second transistor 102. In each TFT, the gate electrode was disposed at the lower layer as compared with the semiconductor layer that forms the channel of each TFT. Moreover, the gate line was disposed at the upper layer as compared with the semiconductor layer, the gate line being composed of a material that is different from a material of which the gate electrode was composed. The gate electrode and the gate line were connected to each other via a through-hole which was bored in the insulation film. Specifically, as illustrated in FIG. 2C, via a through-hole 123 which was bored in the gate insulation film 111 and a first interlayer insulation film 122, the gate electrode 108 of the first transistor 101, which was formed at the lower layer as compared with the semiconductor layers 112 and 113 that form the channels, was connected to the scanning line 104, i.e., the gate line 104 disposed at the upper layer as compared with the semiconductor layers 112 and 113. This allows that, even in the case where the polycrystalline-Si film which necessitates high-temperature formation was applied to the semiconductor layer of the stagger-type TFTs, the gate electrode disposed at the lower layer as compared with the semiconductor layer can be formed by using a high-heat-resistant material which is capable of resisting the high temperature at the time of the polycrystalline-Si film formation. Simultaneously, independently of this employment of the high-heat-resistant material as the gate electrode, the gate line, which was disposed at the upper layer as compared with the semiconductor layer and which is not exposed to the high temperature at the time of the polycrystalline-Si film formation, can be formed by using a low-resistance material.

The materials employable as the gate electrodes 108 and 109 disposed at the lower layer as compared with the semiconductor layers 112 and 113 are as follows: A high-melting-point metal such as Mo, Ti, Ta, W, Nb, or Cr, or an alloy of these metals, or a multilayered film of these metals, or an Al alloy containing at least one of Si, Cu, Pd, Ni, Ta, Ti, Zr, Hf, Sc, Y, Ce, and Nd, or an oxide transparent electrically-conductive film such as ITO, IZO, IGO, ITZO, IGZO, ZnO, AZO, or GZO. Employing these components as the electrode material makes it easy to ensure the heat-resistant property against the high-temperature process at the time of the polycrystalline-Si film formation. With respect to the gate line 104 disposed at the upper layer as compared with the semiconductor layers 112 and 113, ensuring the heat-resistant property becomes unnecessary. As a result, a low-resistance metal such as Al, Cu, or Ag, or an alloy of these metals, or a multilayered film containing these metals becomes employable. This feature makes it easy to ensure the low-resistance gate line.

With respect to the gate electrodes 108 and 109, the matrix-like pull-around installation which is requested for the gate line 104 becomes unnecessary. As a result, the low-resistance implementation based on the thickening of the film thickness becomes unnecessary. Accordingly, it becomes possible to make the film thickness of the gate electrodes thinner than that of the gate line 104. Consequently, the arbitrary thickening of the film thickness is made possible as it becomes unnecessary to take the line resistance into consideration. Desirably, the film thickness can be set in a range from 20 nm to 100 nm. More desirably, the film thickness can be set in a range from 20 nm to 50 nm. The thinning of the film thickness makes it possible to reduce the thermal tension that becomes the cause of generation of the hillock or void which is accompanied by the heat treatment. As a result, it becomes possible to achieve an enhancement in the heat-resistant property even in the case where the Al alloy was employed as the gate electrodes.

Furthermore, the step-difference caused to occur by the patterns of the gate electrodes 108 and 109 disposed at the lowest layer can be made small. This feature makes it possible to ensure the step coverage of the insulation film and the lines to be formed on the patterns of the gate electrodes, i.e., specifically, the gate insulation film 111, the semiconductor layers 112 and 113, the source and drain electrodes 117, 118, 119, and 120, and further, the gate line 104, thereby allowing for a suppression of the short-circuit or disconnection caused by the step-difference. The thinning of the film thickness also makes it easy to ensure the configuration of the normal taper machining for the gate-electrode patterns themselves. Basically the same effect can be expected with respect to the lower electrode 110 of the capacitor 103 formed of the same layer and the same component as the gate electrodes 108 and 109. Also, taking the step coverage into consideration also becomes unnecessary for the gate insulation film and the semiconductor layers. As a result, the thinning of the film thickness becomes possible. Accordingly, it also becomes possible to achieve an enhancement in the characteristics such as reduction in the threshold-value voltage or off current of each TFT. Desirably, the film thickness of the gate insulation film 111 can be set in a range from 100 nm to 300 nm. More desirably, the film thickness can be set in a range from 100 nm to 200 nm.

With respect to the semiconductor layers 112 and 113, taking the heat damage to the lines into consideration becomes unnecessary. This feature makes it possible to use the polycrystalline Si or SiGe film which is required to be formed by high-temperature formation. This allows acquisition of the stagger-type TFT having excellent characteristics, which can exhibit a high mobility and a small threshold-value (Vth) shift, and which is necessary for driving each organic electro-luminescent element. For example, a polycrystalline film, which is formed using the reaction-heat CVD method where a hydrogen-containing compound and a halogen-containing compound were used, is employable as the semiconductor layers. The configuration of the present invention is applicable to whatever cases, as long as they are the cases where the high-temperature process is required as the formation method for the polycrystalline-Si film. Accordingly, in addition to the reaction-heat CVD method, the configuration of the present invention is also applicable to the case where the plasma CVD method was used. Also, the configuration is applicable to the case where the laser annealing is used. Applying the configuration of the present invention thereto makes it unnecessary to execute the selective illumination with laser light such that the main wiring line portion is avoided. In this point, the configuration of the present invention becomes more advantageous as compared with the conventional technologies.

On account of the employment of the above-described configuration, as illustrated in FIG. 2D, the scanning line 104, i.e., the gate line 104 disposed at the upper layer as compared with the semiconductor layers 112 and 113, was also disposed at the upper layer as compared with the signal line 105, i.e., the drain line 105, the first current supply line 106, and the second current supply line 107 via the first interlayer insulation film 122. As a result, the scanning line 104 forms an intersection portion with these lines via the first interlayer insulation film 122. The entire surface of the gate line 104 was coated with a second interlayer insulation film 125 provided under each organic electro-luminescent element for implementing the pixel planarization except for the terminal portion which becomes a connection portion with an external circuit. In the present embodiment, the second interlayer insulation film 125 was co-used with the insulation-film configuration components of each organic electro-luminescent element. This co-use makes it possible to suppress an increase in the steps, processes, and configuration components. Also, taking the step coverage of the upper-layer film into consideration also becomes unnecessary for the gate line 104. As a result, the low-resistance implementation based on the arbitrary thickening of the film thickness was made possible.

Meanwhile, as illustrated in FIG. 2A and FIG. 2B, the source electrode 117 of the first transistor 101 was connected on its extended line to the signal line 105, i.e., the drain line 105. The drain electrode 118 of the first transistor 101 was connected to the gate electrode 109 of the second transistor 102 and the lower electrode 110 of the capacitor 103. The drain electrode 120 of the second transistor 102 was connected to the upper electrode 121 of the capacitor 103 and the first current supply line 106. The source electrode 119 of the second transistor 102 was connected to the lower electrode 2 of each organic electro-luminescent element.

Next, explanation will be given below concerning a fabrication method for the organic electro-luminescent element portion based on the above-described configuration. In the following embodiment of the fabrication method, the explanation will be given based on the configuration example where the lower electrode is anode, and where the upper electrode is cathode. The present invention, however, is not limited to this configuration. The present invention is also applicable to the configuration example where the lower electrode is cathode, and where the upper electrode is anode.

First, as illustrated in FIG. 2A to FIG. 2F, the gate electrodes 108 and 109, and the lower electrode 110 of the capacitor 103 according to the present invention were formed on a glass substrate 116. As described earlier, the materials applicable as the gate-electrode material are high-melting-point metals, or an alloy of these metals, or a multilayered film of these metals, or Al alloys having the heat-resistant property, or transparent electrically-conductive oxide films. These films can be formed using the sputtering method. In the present embodiment, Cr was employed, and the film thickness was set at 80 nm. Next, the gate-electrode patterns 108 and 109, and the lower-electrode pattern 110 of the capacitor 103 were machined using photolithography.

Next, the gate insulation film 111 was formed on the gate electrodes 108 and 109, and the lower electrode 110 of the capacitor 103. The materials applicable as the gate insulation film 111 are $SiO_2$, SiN, and the like. These films can be formed using the plasma CVD method, sputtering method, and the like. Otherwise, the plasma oxidation, optical oxidation, and the like may be used simultaneously. In the present embodiment, an $SiO_2$ film formed by the plasma CVD method using TEOS was employed. The film thickness was set at 150 nm.

Next, as illustrated in FIG. 2A and FIG. 2B, as the semiconductor layers 112 and 113, the polycrystalline films were formed on the gate insulation film 111, using the reaction-heat CVD method which allows the excellent crystalline property to be acquired at 400° C. or higher high temperature. Specifically, employing $GeF_4$, $F_2$, and $Si_2H_6$ as the reaction gas, and He as the dilute gas, the polycrystalline-SiGe film was formed under the following condition: $GeF_4$: 0.3 sccm, $Si_2H_6$: 0.3 sccm, He: 1 slm, substrate temperature: 500° C., and gas pressure: 665 Pa. The film thickness was set at 200 nm. In the present embodiment, the combination of $GeF_4$ and $Si_2H_6$ was employed as the reaction gas. It is also possible, however, that the polycrystalline-Si film can be formed by employing, e.g., $F_2$ instead of $GeF_4$.

Next, $p^+$ Si films, which become dope layers 114 and 115 that are contact layers, were formed using the plasma CVD method. The film thickness was set at 40 nm. Additionally, the polarity of the dope layers 114 and 115 is not limited to the $p^+$ Si films, but can be changed arbitrarily to $n^+$ Si films depending on the TFT configuration of the pixel circuit. After the above-described formation, multilayered films of the $p^+$Si films 114 and 115 and the semiconductor layers 112 and 113 were machined into an island-like configuration.

Next, as illustrated in FIG. 2A, a through-hole 116 for connecting the drain electrode 118 of the first transistor 101 with the gate electrode 109 of the second transistor 102 was formed into the gate insulation film 111 over the gate electrode 109 of the second transistor 102.

Next, as illustrated in FIG. 2A, FIG. 2B, FIG. 2A, and FIG. 2B, the source and drain electrodes 117, 118, 119, and 120, the drain line 105, the upper electrode 121 of the capacitor 103, the first current supply line 106, and the second current supply line 107 which becomes an auxiliary line for the upper electrode 12 of each organic electro-luminescent element (which will be described later), were formed on the gate insulation film 111. The materials applicable as the source and drain electrodes 117, 118, 119, and 120, the drain line 105, the capacitor upper-electrode 121, the first current supply line 106, and the second current supply line 107 are the low-resistance metals such as Al, Cu, or Ag, or an alloy of these metals, or a multilayered film containing these metals. This is because the semiconductor layers 112 and 113 have been already formed, and thus the upper-limit temperature can be lowered. In the present embodiment, a Mo/AlNd-alloy/Mo multilayered film was formed using the sputtering method, considering compatibility with the contact characteristics. The film thicknesses were set at 50/350/50 nm. Next, the machining into the source-and-drain-electrodes patterns 117, 118, 119, and 120, the drain-line pattern 105, the capacitor upper-electrode pattern 121, the first current supply line pattern 106, and the second current supply line pattern 107 was performed using the photolithography.

Next, as illustrated in FIG. 2A and FIG. 2B, the p$^+$ Si films on the channel regions were etched with the source and drain electrodes 117, 118, 119, and 120 used as masks, thereby forming the contact layers 114 and 115.

Next, using the plasma CVD method, a SiN film was formed as the first interlayer insulation film 122 on the source and drain electrodes 117, 118, 119, and 120 and the drain line 105. The film thickness was set at 500 nm.

Next, as illustrated in FIG. 2C and FIG. 2D, the through-hole 123 for connecting the gate electrode 108 of the first transistor 101 with the gate line 104 was formed into the multilayered film of the gate insulation film 111 and the first interlayer insulation film 122.

Next, as illustrated in FIG. 2C and FIG. 2D, the gate line 104 according to the present invention was formed on the through-hole 123. As described earlier, ensuring the heat-resistant property becomes unnecessary for the gate line 104. As a result, the low-resistance metal such as Al, Cu, or Ag, or an alloy of these metals, or a multilayered film containing these metals becomes applicable. This feature makes it easy to ensure the low-resistance gate line even when the high-temperature formation of the semiconductor layers 112 and 113 was performed. In the present embodiment, a Mo/AlNd-alloy multilayered film was employed, considering compatibility with the contact characteristics. The film thickness of Mo was set at 50 nm, and the film thickness of the AlNd alloy was set at 400 nm. Next, machining into the gate-line pattern 104 was performed using the photolithography.

Next, as illustrated in FIG. 2B and FIG. 2F, a through-hole 124 for connecting the drain electrode 120 of the second transistor 102 with the lower electrode 2 of each organic electro-luminescent element, and a through-hole 127 for connecting the second current supply line 107 with the upper electrode 12 of each organic electro-luminescent element were formed into the first interlayer insulation film 122.

Next, a second interlayer insulation film 125 was formed on the through-holes as a component which serves as an interlayer insulation film for coating the entire surface of the gate line 104 to insulate the gate line 104 from the organic electro-luminescent element portion, as well as the planarization film for forming each organic electro-luminescent element. Specifically, a 2 μm thick photosensitive acrylic insulation film was employed. As illustrated in FIG. 2B and FIG. 2F, the through-hole portion 124 for connecting the drain electrode 120 of the second transistor 102 with the lower electrode 2 of each organic electro-luminescent element, and the through-hole portion 127 for connecting the second current supply line 107 with the upper electrode 12 of each organic electro-luminescent element were formed such that the aperture portions were overlapped with each other, using the photolithography which utilizes the photosensitive property of the acrylic insulation film.

Next, as illustrated in FIG. 2B, FIG. 2E, and FIG. 2F, a 150 nm thick Cr film was formed on the second interlayer insulation film using the sputtering method, then forming the lower electrode 2 of each organic electro-luminescent element using the photolithography. As illustrated in FIG. 2B, the lower electrode 2 was connected to the drain electrode 120 of the second transistor 102 via the through-hole 124.

Next, as the third interlayer insulation film 126, a 2 μm thick photosensitive acrylic insulation film was formed on the lower electrode 2. The third interlayer insulation film 126 is the bank insulation film for preventing the lower electrodes 2 to 4 and the upper electrode 12 of each organic electro-luminescent element from establishing the short-circuit to each other. Specifically, as illustrated in FIG. 1, FIG. 2E, and FIG. 2F, the third interlayer insulation film 126 was formed such that portions which were positioned inside by 3 μm from pattern end portions of the lower electrodes 2 to 4 were coated excluding the pixel aperture portions 14, 15, and 16, and using the photolithography which utilizes the photosensitive property of the acrylic insulation film. At the same time, as illustrated in FIG. 2B and FIG. 2F, the through-hole portion 124 for connecting the drain electrode 120 of the second transistor 102 with the lower electrode 2 of each organic electro-luminescent element, and the through-hole portion 127 for connecting the second current supply line 107 with the upper electrode 12 of each organic electro-luminescent element were formed such that the aperture portions were overlapped with each other.

Incidentally, in the present embodiment, the photosensitive acrylic insulation film was employed as the second interlayer insulation film 125 and the third interlayer insulation film 126. The material desirable as the insulation films, however, is not limited thereto. Namely, the specific desirable materials are an organic material such as polyimide, polychloropiren, polyethylene terephthalate, polyoxymethylene, polyvinyl chloride, polyvinylidene fluoride, cyanoethylprurane, polymethylmethacrylate, polysulfone, or polycarbonate, or an inorganic material such as $SiO_2$, $SiN_x$, or $Al_2O_3$. Also, a configuration is also implementable where inorganic insulation films are multilayered on an organic insulation film.

Next, the explanation will be given below concerning the fabrication method for the organic electro-luminescent element portion after the formation of the lower electrodes 2 to 4 and the third interlayer insulation film 126, i.e., the bank insulation film. First, as illustrated in FIG. 2E and FIG. 2F, a 50 nm thick 4,4'-bis[N-(1-naphthyl)-N-phenylamino] biphenyl (which, hereinafter, will be referred to as "α-NPD") film was formed on the lower electrode 2, using the vacuum evaporation method. This α-NPD film functions as the hole transport layer 6.

Next, as illustrated in FIG. 2E and FIG. 2F, each R, G, and B color electro-luminescent element was formed on each subpixel. The lower electrode 2 functions as a subpixel of red (R) emitted-light color. In the present embodiment, as a R electro-luminescent layer 18, a 30 nm thick film formed by simultaneously evaporating tris (8-quinolinol) aluminum (which, hereinafter, will be referred to as "Alq3") and coumarin was formed on the hole transport layer 6, using the vacuum evaporation method. The lower electrode 3 functions as a subpixel of green (G) emitted-light color. In the present embodiment, as a G electro-luminescent layer 19, a 30 nm thick film formed by simultaneously evaporating Alq3 and quinacridone was formed on the hole transport layer 6, using the vacuum evaporation method. The lower electrode 4 functions as a subpixel of blue (B) emitted-light color. In the present embodiment, as a B electro-luminescent layer 20, a 30 nm thick film formed by simultaneously evaporating Alq3 and a styrylamine compound 1,4'-bis [N-(3-methylphenyl)-N'-phenyl-4-aminophenylvinylene]-2,5-dimethoxybenzene (which, hereinafter, will be referred to as "DSA") was formed on the hole transport layer 6, using the vacuum evaporation method. Each of the above-described R, G, and B each-color electro-luminescent layers 18 to 20 was patterned by a mask evaporation using an accurate mask which has an aperture pattern in size equivalent to the size of each subpixel.

Next, as illustrated in FIG. 2E and FIG. 2F, the 30 nm thick Alq3 film was evaporated onto the R, G, and B color electro-luminescent layers 18 to 20, using the vacuum evaporation method. This Alq3 film functions as the electron transport layer 10.

Next, as illustrated in FIG. 2E and FIG. 2F, as the electron injection layer 11, a 10 nm thick mixture film of Mg and Ag was formed on the electron transport layer 10, using the two-dimensional simultaneous vacuum evaporation method.

Next, as illustrated in FIG. 2A to FIG. 2F, a 50 nm thick IZO film was formed using the sputtering method. This film is a transparent electrically-conductive film composed of an amorphous oxide of indium and zinc, and functions as the upper transparent electrode 12 of each organic electro-luminescent element. As illustrated in FIG. 1 and FIG. 2F, the upper electrode 12 was connected to the second current supply line 107, i.e., the auxiliary line, via the through-holes 127, 127', and 127" provided within each pixel region.

The execution of the foregoing fabrication method makes it possible to form a TFT substrate 13 where the driving circuit and the plurality of organic electro-luminescent elements were formed on the glass substrate 21. Hereinafter, the explanation will be given below concerning an assembly method for the organic electro-luminescent display apparatus. Specifically, as illustrated in FIG. 2E and FIG. 2F, the TFT substrate 13 formed using the above-described method was sealed without being exposed to the atmosphere, using a glass substrate 14 which becomes a sealing substrate. This sealing was executed inside a sealing room where a high dew point is maintained by circulating a dried nitrogen gas. First, using a seal dispenser apparatus, a photo curing resin was deposited at an edge portion of the sealing glass substrate 14 (illustration is omitted). Next, this sealing glass substrate 14 and the TFT substrate 13 are opposed to each other, then being pasted and made to adhere to each other by being pressed. Moreover, a light-shielding plate was placed on the outside of the sealing glass substrate 14 so that the portion where the electro-luminescent elements were formed is not illuminated by UV light. Finally, the TFT substrate 13 was sealed in such a manner that the photo curing resin was cursed by being illuminated by the UV light from the side of the sealing glass substrate 14.

Figure 2G:
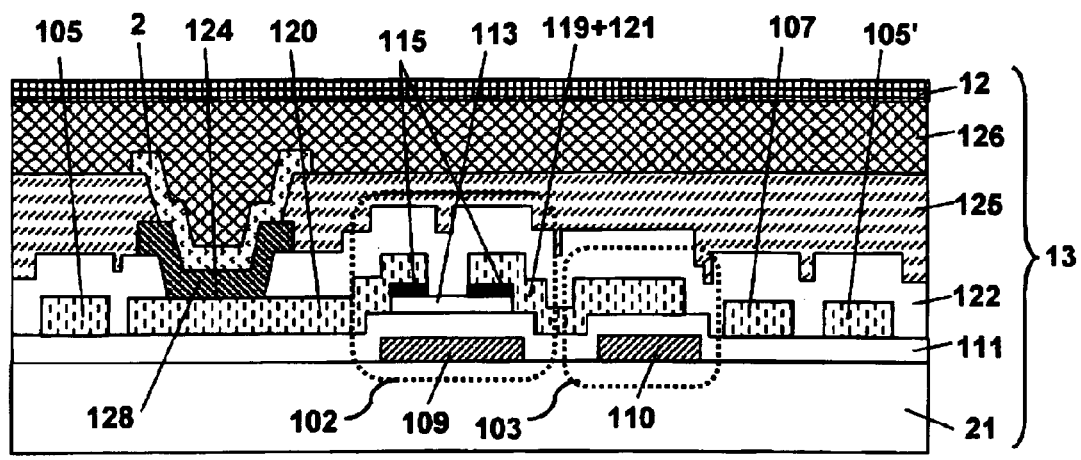
FIG. 2G is a cross-sectional view of the apparatus along the G-G' line in FIG. 1.
Figure 2H:
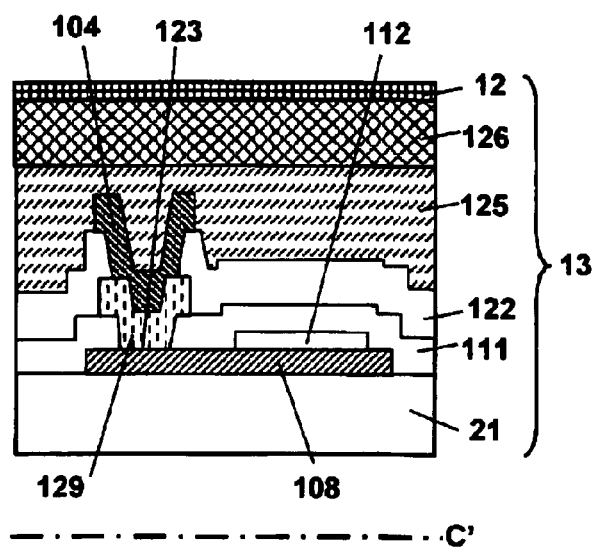
FIG. 2H is a cross-sectional view of the apparatus along the H-H' line in FIG. 1.

The execution of the foregoing fabrication method makes it possible to form the top-emission-type organic electro-luminescent display apparatus provided with the configuration of the present invention. In the above-described first embodiment, as illustrated in FIG. 2G, the following configuration is also possible: A pad electrode 128, which was formed using the same material and the same step as those of the gate line 104, was provided in the through-hole portion 124 for connecting the drain electrode 120 of the second transistor 102 with the lower electrode 2 of each organic electro-luminescent element. Then, the drain electrode 120 and the lower electrode 2 were connected to each other via this pad electrode 128. On account of this configuration, the surface damage onto the drain electrode 120, when the through-hole 124 was formed into the multilayered insulation film, can be reduced by the amount equivalent to the aperture into the second interlayer insulation film 125. Similarly, as illustrated in FIG. 2H, the following configuration is also possible: A pad electrode 129, which was formed using the same material and the same step as those of the drain line 105, was provided in the through-hole portion 123 for connecting the gate electrode 108 of the first transistor 101 with the gate line 104. Then, the gate electrode 108 and the gate line 104 were connected to each other via this pad electrode 129. On account of this configuration, the formation step of the through-hole 123 into the multilayered insulation film can be divided into two times. Accordingly, the surface damage onto the gate electrode 108, when the through-hole 123 was formed into the multilayered insulation film, can be reduced by the amount equivalent to the aperture into the first interlayer insulation film 122. Also, ensuring the normal taper configuration of the end portion of the through-hole 123 becomes easier by the amount in which the respective through-hole formations become formations of the single-layer insulation films 111 and 122. The first-time formation of the aperture was performed simultaneously with the formation of the through-hole 116 for connecting the drain electrode 118 of the first transistor 101 with the gate electrode 109 of the second transistor 102. This also makes it possible to avoid an increase in the steps.

Figure 2I:
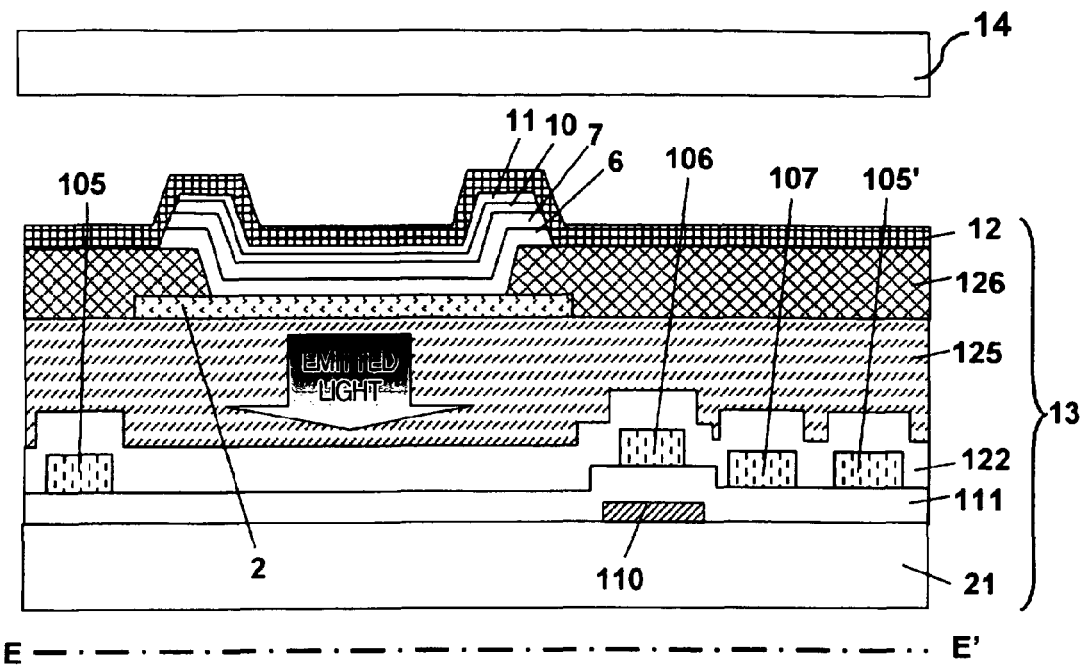
FIG. 2I is a cross-sectional view of the apparatus along the I-I' line in FIG. 1.
Figure 2J:
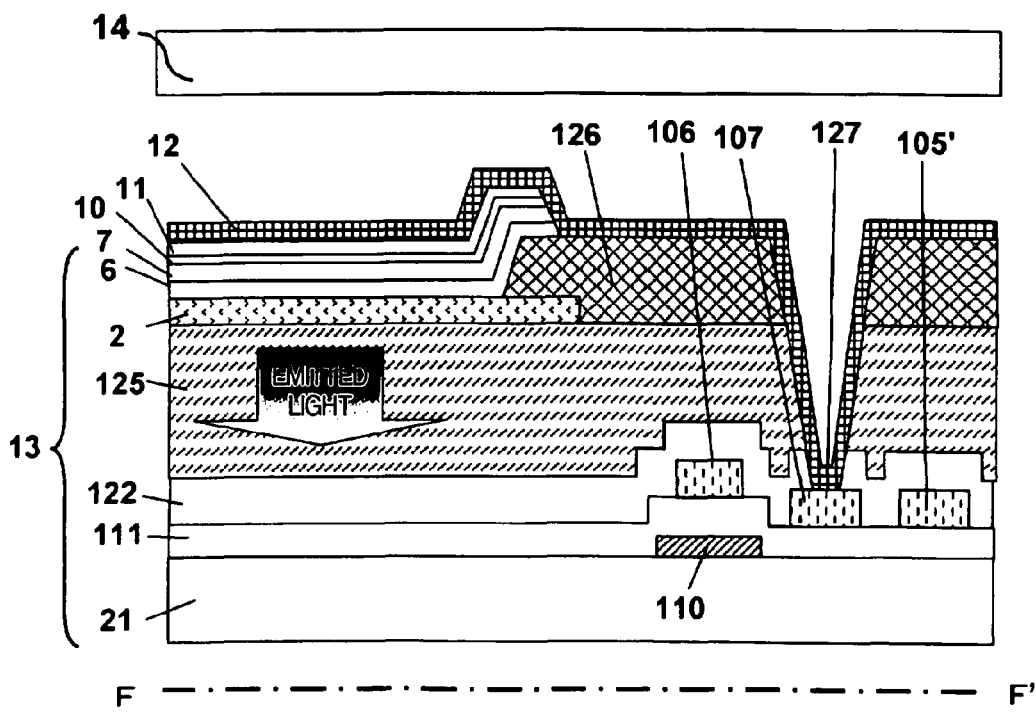
FIG. 2J is a cross-sectional view of the apparatus along the J-J' line in FIG. 1.

Also, in the above-described first embodiment, as illustrated in FIG. 2I and FIG. 2J, it is of curse possible to form the bottom-emission-type organic electro-luminescent display apparatus which extracts light from the side of the lower electrode 2. This is made possible by configuring the lower electrode 2 of each organic electro-luminescent element with a transparent electrically-conductive oxide film such as ITO, and by configuring the upper transparent electrode 12 with a metal having excellent refection property such as Al. As described earlier, the ITO and Al films can be formed by using the sputtering method or vacuum evaporation method.

Figure 3:
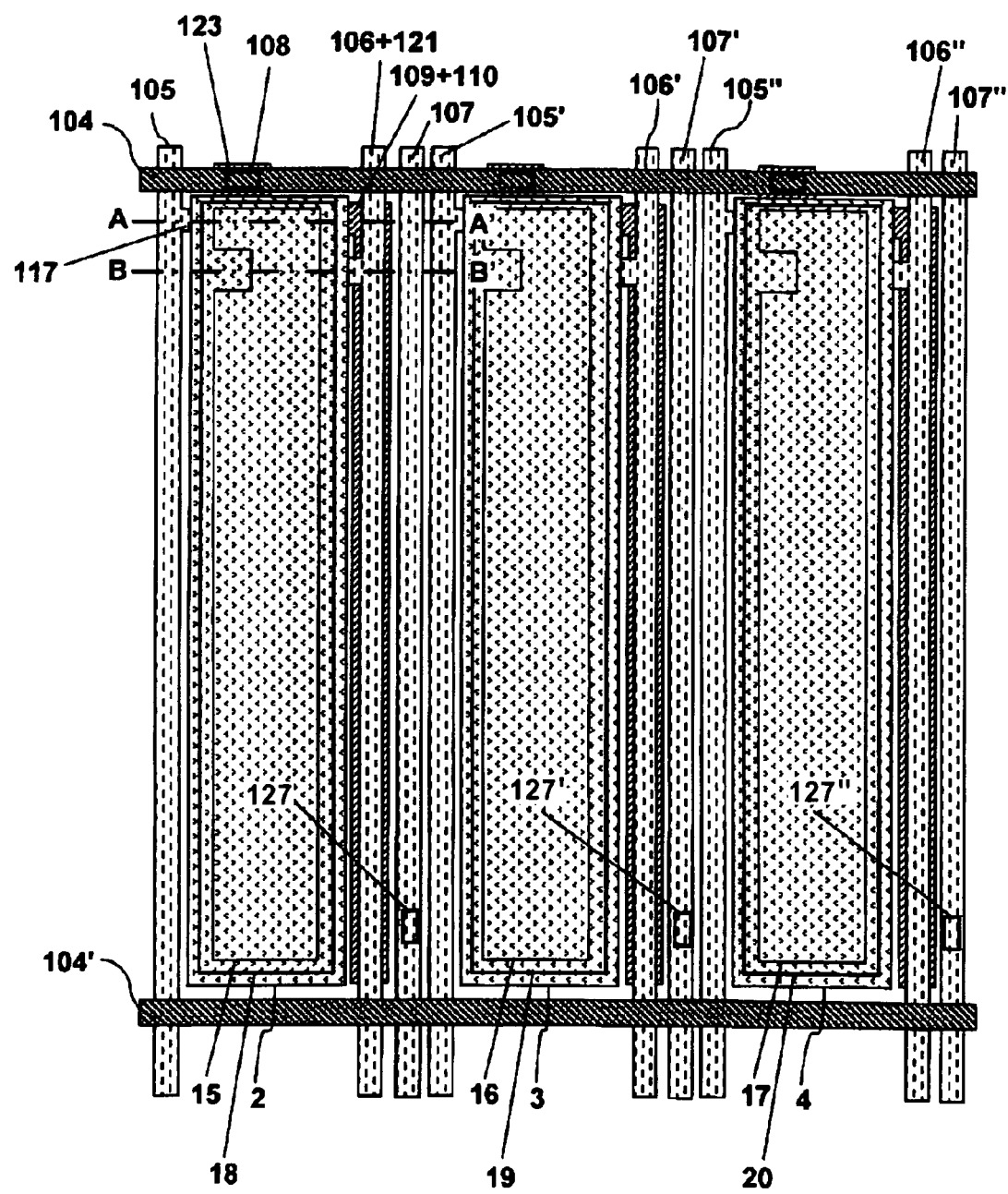
FIG. 3 is a plane view of one color pixel for indicating an application example of the organic electro-luminescent display apparatus according to the first embodiment of the present invention.
Figure 4A:
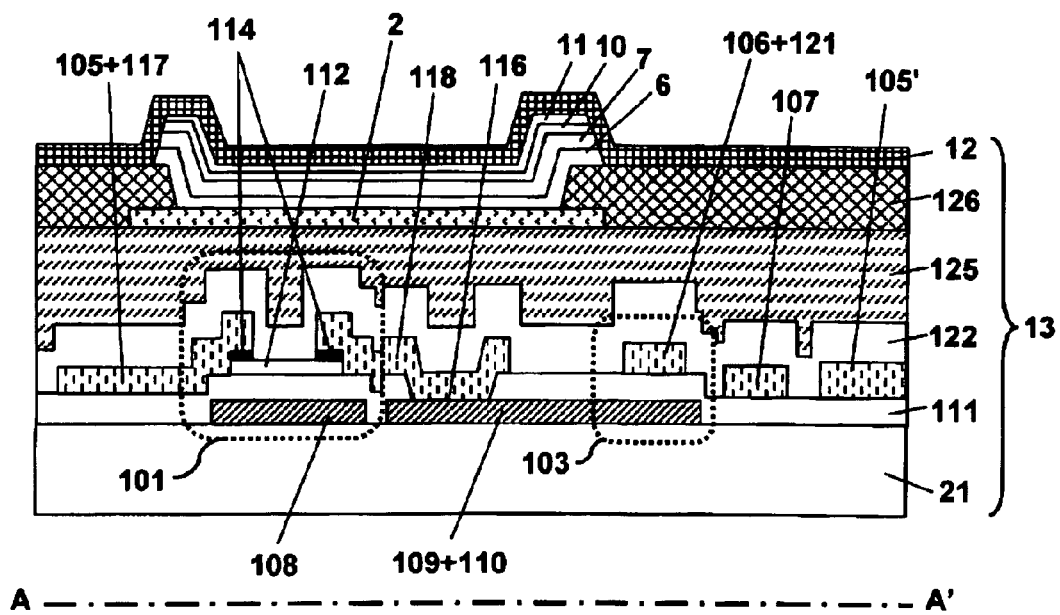
FIG. 4A is a cross-sectional view of the apparatus along the A-A' line in FIG. 3.
Figure 4B:
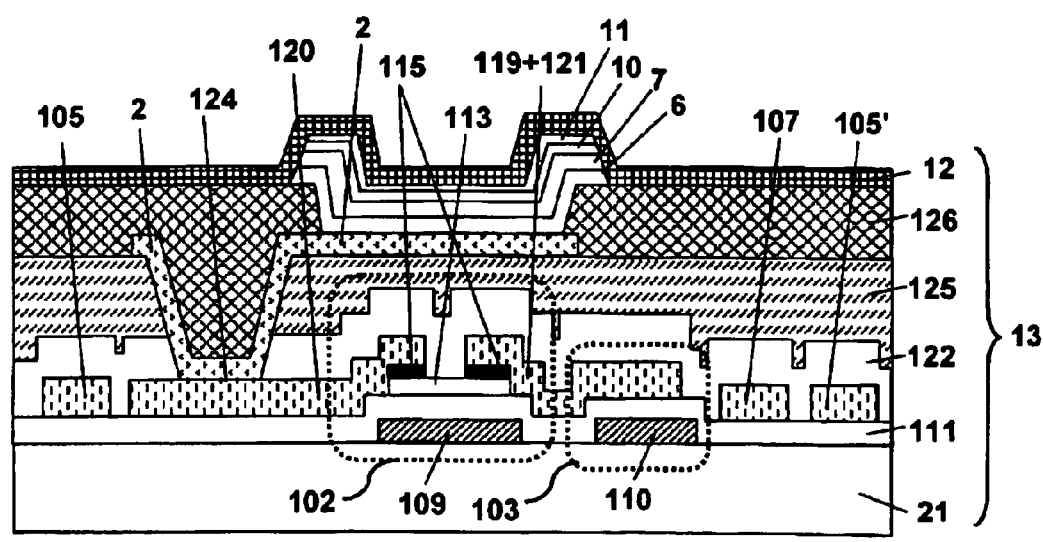
FIG. 4B is a cross-sectional view of the apparatus along the B-B' line in FIG. 3.

Also, in the above-described first embodiment, the configuration has been employed where the entire surface of the first transistor 101 and the second transistor 102 was coated with the second interlayer insulation film 125 which serves as the planarization film as well. On account of this configuration, when forming the top-emission-type organic electro-luminescent display apparatus which extracts light from the side of the upper electrode 12, as illustrated in FIG. 3, FIG. 4A, and FIG. 4B, it becomes possible to arrange the lower electrodes 2 to 4 of each organic electro-luminescent element in such a manner that the lower electrodes 2 to 4 was super-posed on the first transistor 101 and the second transistor 102. The pixel aperture portions 15 to 17 configured with the organic electro-luminescent elements can be extended by just that amount, which allows an enhancement in the aperture ratio. Furthermore, although not illustrated, with respect to the surfaces of the gate line 104, the drain line 105, the first current supply line 106, and the second current supply line 107 disposed under the second interlayer insulation film 125, the superposing arrangement is similarly possible by extending the pixel aperture portions 15 to 17, as long as the surface region excluding the through-hole connection portion 124 with the lower electrodes 2 to 4 of each organic electro-luminescent element, and the through-hole connection portion 127 with the upper electrode 12 thereof.

Embodiment 2

Figure 5:
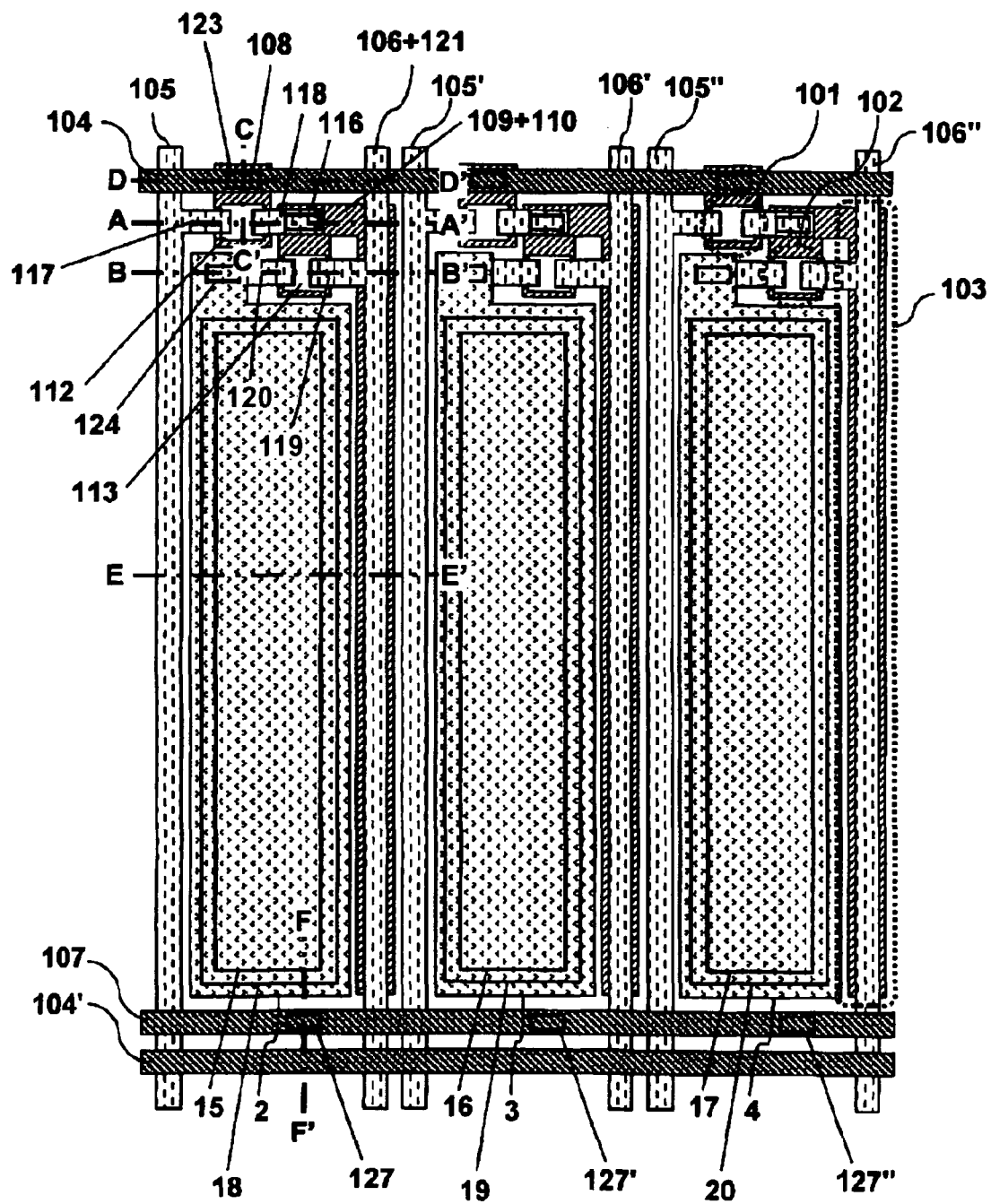
FIG. 5 is a plane view of one color pixel of an organic electro-luminescent display apparatus according to a second embodiment of the present invention.
Figure 6A:
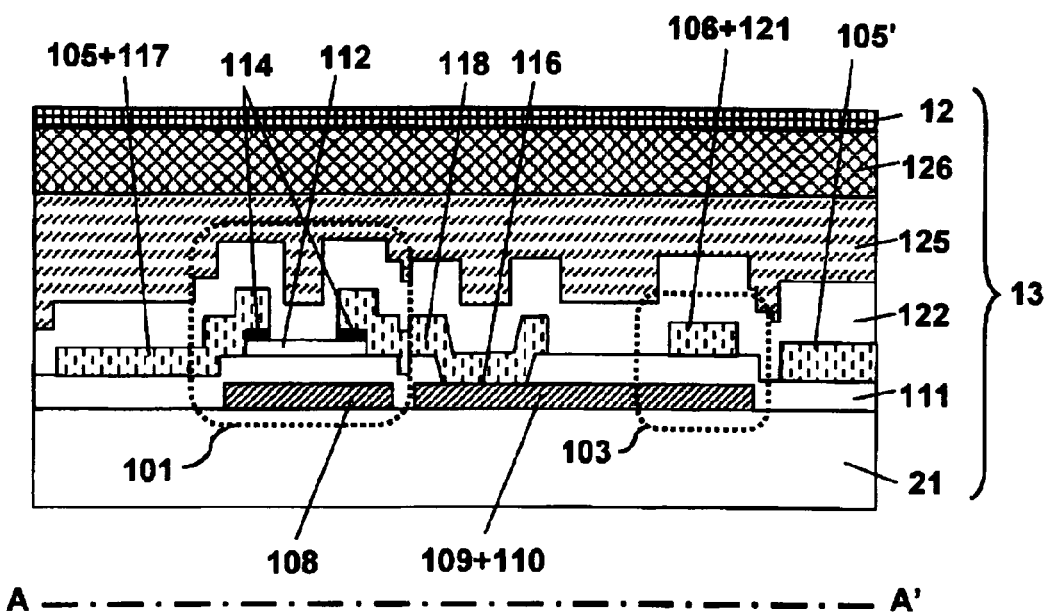
FIG. 6A is a cross-sectional view of the apparatus along the A-A' line in FIG. 5.
Figure 6B:
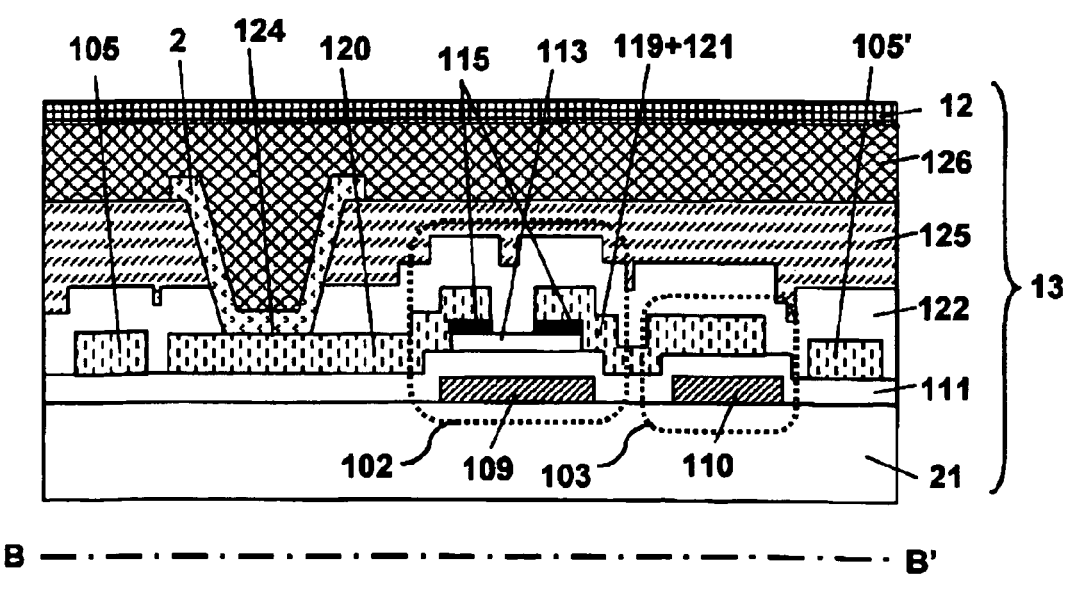
FIG. 6B is a cross-sectional view of the apparatus along the B-B' line in FIG. 5.
Figure 6C:
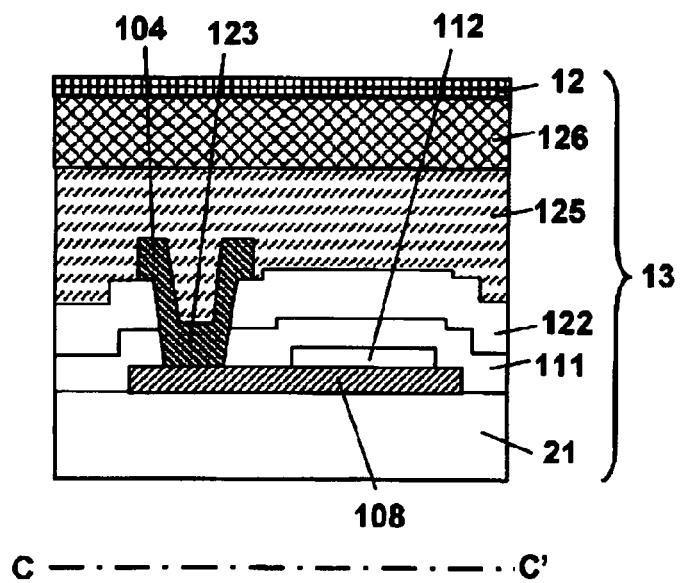
FIG. 6C is a cross-sectional view of the apparatus along the C-C' line in FIG. 5.

FIG. 5 is a plane view of one color pixel of an organic electro-luminescent display apparatus according to a second embodiment of the present invention. FIG. 6A is a cross-sectional view of the apparatus along an A-A' line. FIG. 6B is a cross-sectional view of the apparatus along a B-B' line. FIG. 6C is a cross-sectional view of the apparatus along a C-C' line.

Figure 6D:
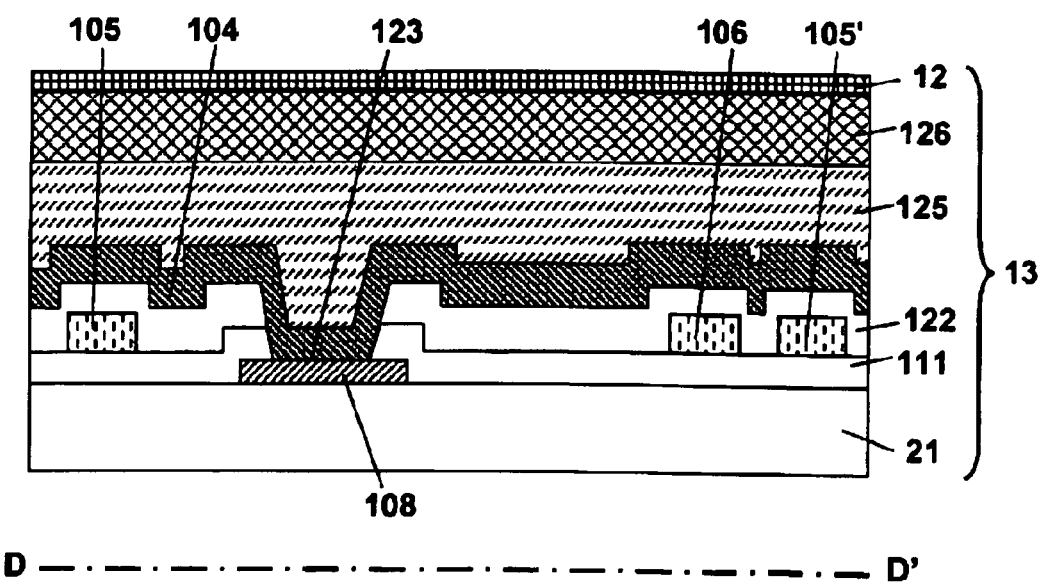
FIG. 6D is a cross-sectional view of the apparatus along the D-D' line in FIG. 5.
Figure 6E:
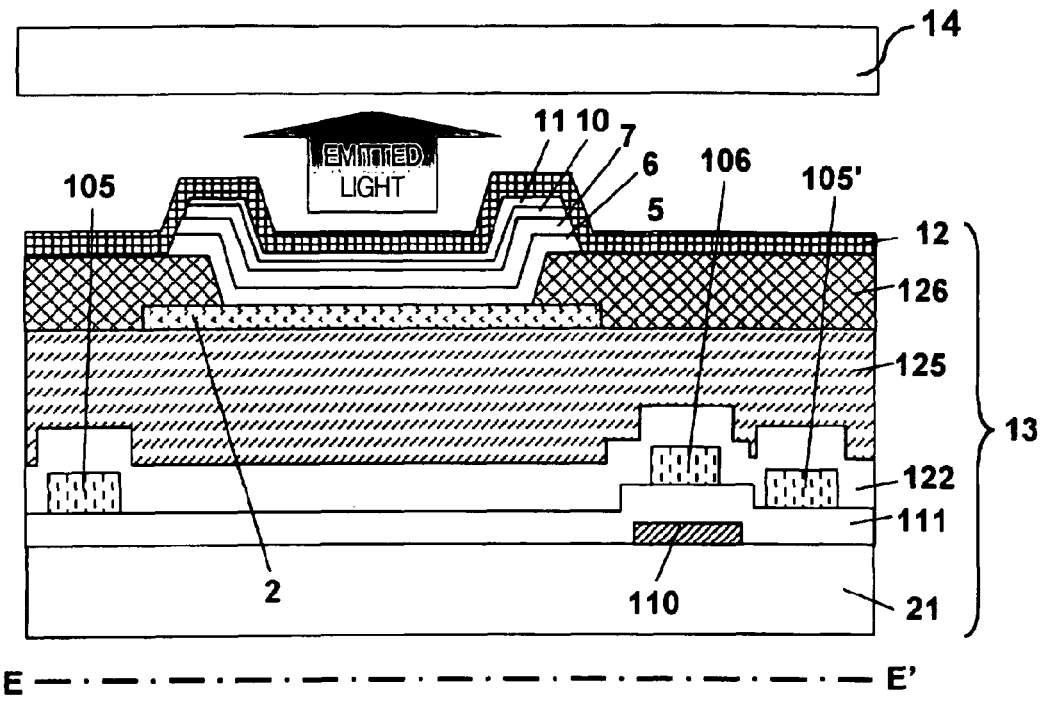
FIG. 6E is a cross-sectional view of the apparatus along an E-E' line in FIG. 5.
Figure 6F:
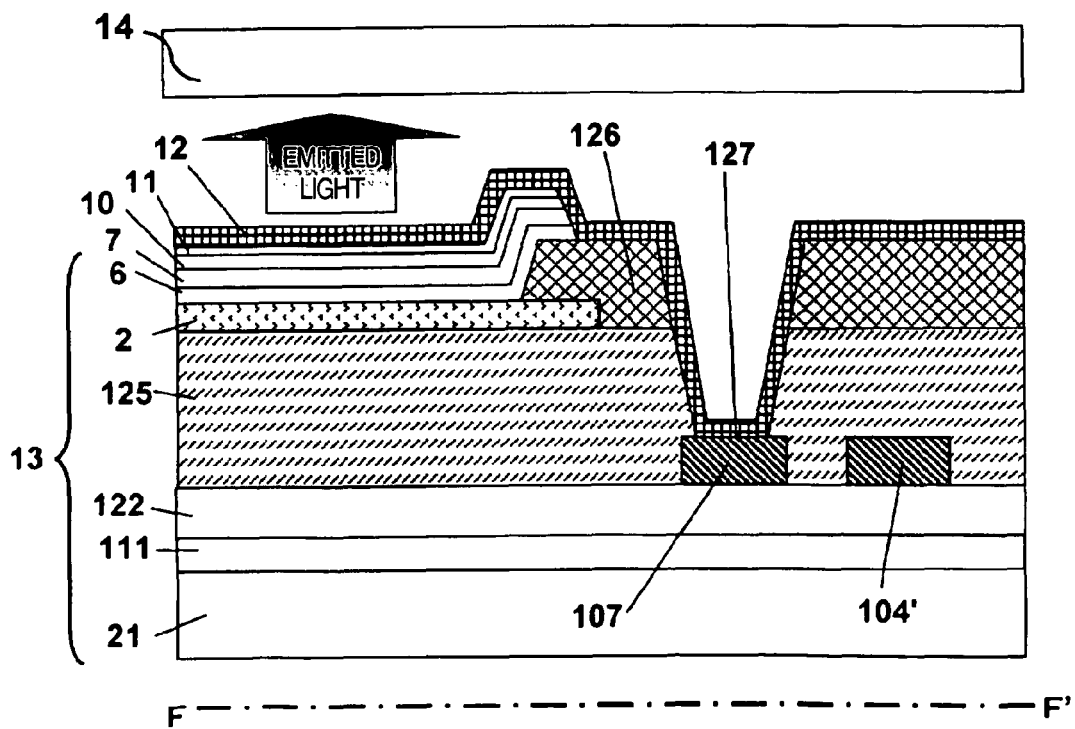
FIG. 6F is a cross-sectional view of the apparatus along the F-F' line in FIG. 5.

FIG. 6D is a cross-sectional view of the apparatus along a D-D' line. FIG. 6E is a cross-sectional view of the apparatus along an E-E' line. FIG. 6F is a cross-sectional view of the apparatus along an F-F' line. The point which differs from the above-described first embodiment is as follows: The gate line 104 of the present invention disposed at the upper layer as compared with the semiconductor layers 112 and 113, and the auxiliary line 107 of the upper transparent electrode 12, i.e., the second current supply line 107, were configured with the same layer and the same component. Based on this feature, while ensuring the heat-resistant property of the gate electrodes 108 and 109 of the present invention, and the low-resistance property of the gate line 104 of the present invention disposed at the upper layer as compared with the semiconductor layers 112 and 113, the gate line 104 is co-used with the configuration component of the auxiliary line 107 of each organic electro-luminescent element. This co-use makes it possible to suppress an increase in the process on the line formation step and configuration components. As illustrated in FIG. 5, in order to avoid the intersection between the lines disposed in the same layer, the gate line 104 and the auxiliary line 107 need to be disposed by being drawn in the same direction. However, in comparison with the first embodiment where the auxiliary line 107 and the drain line 105 were formed in the same layer, the gate line 104 and the second current supply line 107, and the drain line 105 and the first current supply line 106 can be separately arranged in the different layers equally with the first interlayer insulation film 122 placed therebetween. Accordingly, it becomes possible to reduce a lowering in yield due to short-circuit failure between the lines. Also, as illustrated in FIG. 6F, in comparison with the first embodiment where the auxiliary line 107 and the drain line 105 were formed in the same layer, it becomes possible to reduce the step-difference in the through-hole 127 for connecting the auxiliary line 107 with the upper electrode 12 of each organic electro-luminescent element.

Embodiment 3

Figure 7A:
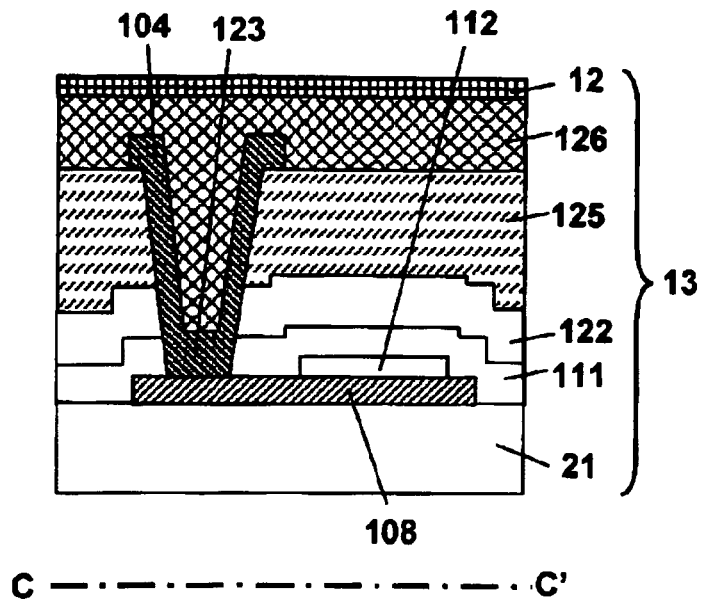
FIG. 7A is a cross-sectional view of an organic electro-luminescent display apparatus according to a third embodiment of the present invention along the C-C' line in FIG. 5.
Figure 7B:
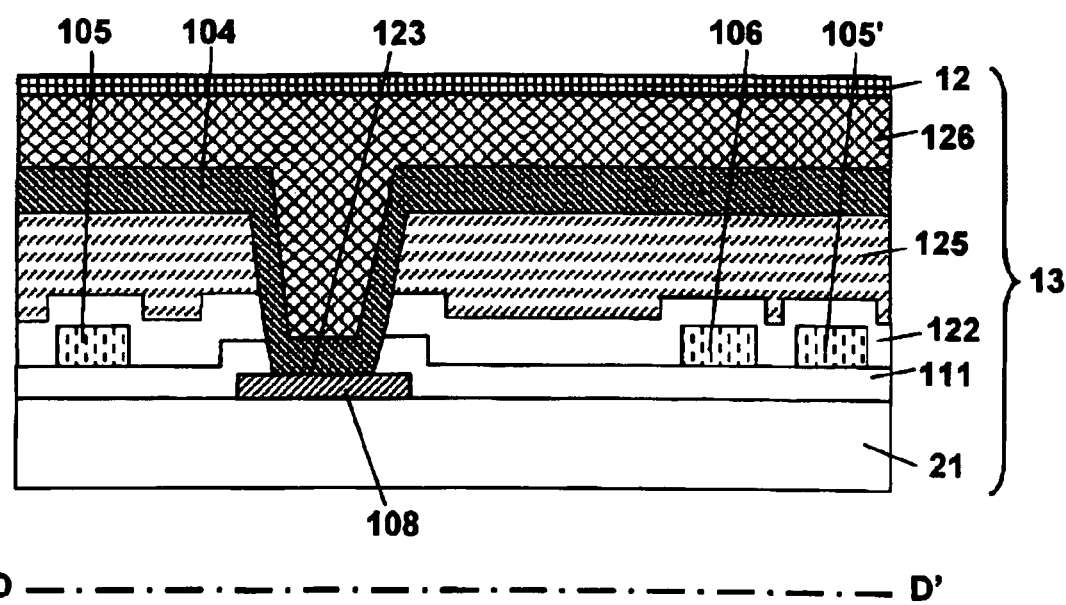
FIG. 7B is a cross-sectional view of the organic electro-luminescent display apparatus according to the third embodiment of the present invention along the D-D' line in FIG. 5.
Figure 7C:
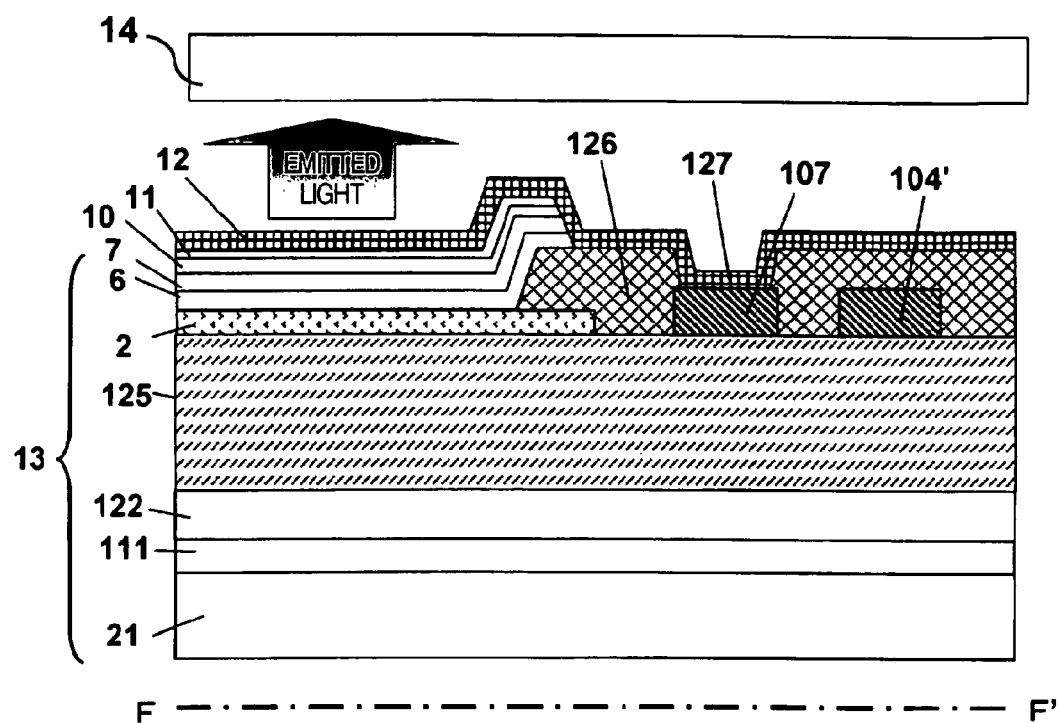
FIG. 7C is a cross-sectional view of the organic electro-luminescent display apparatus according to the third embodiment of the present invention along the E-E' line in FIG. 5.

FIG. 7A is a cross-sectional view of an organic electro-luminescent display apparatus according to a third embodiment along a C-C' line illustrated in FIG. 5. FIG. 7B is a cross-sectional view of the apparatus along a D-D' line. FIG. 7C is a cross-sectional view of the apparatus along an F-F' line. (The plane view of one color pixel and the cross-sectional views along the A-A' line, B-B line, C-C' line, and E-E' line become the same as FIG. 5 and FIG. 6A, FIG. 6B, FIG. 6C, and FIG. 6E, respectively, and thus are omitted.) The point which differs from the above-described first and second embodiments is as follows: The gate line 104 of the present invention disposed at the upper layer as compared with the semiconductor layers 112 and 113 was formed over the second interlayer insulation film 125 and under the bank insulation film 126, i.e., the third interlayer insulation film 126. Based on this feature, while ensuring the heat-resistant property of the gate electrodes 108 and 109 of the present invention, and the low-resistance property of the gate line 104 of the present invention disposed at the upper layer as compared with the semiconductor layers 112 and 113, the interlayer insulation film for coating the surface of the gate line 104 to isolate it from the organic electro-luminescent element portion was co-used with the bank insulation film 126. This co-use makes it possible to suppress an increase in the process on the interlayer insulation film formation step and configuration components. Also, the entire surface of the gate line 104 was coated with the bank insulation film 126 except for the terminal portion which becomes a connection portion with an external circuit. Consequently, taking the step coverage of the upper-layer film into consideration also becomes unnecessary for the gate line 104, thereby the low-resistance implementation based on the arbitrary thickening of the film thickness was made possible.

In the present embodiment, similarly to the second embodiment, the auxiliary line 107 of the upper transparent electrode 12, i.e., the second current supply line 107, was configured with the same layer and the same component as those of the gate line 104 of the present invention. This feature also makes it possible to suppress an increase in the process and configuration components by the amount equivalent to the auxiliary line 107. Also, on account of this, as illustrated in FIG. 7C, the through-hole formation of the through-hole portion 127 for connecting the auxiliary line 107 with the upper electrode 12 of each organic electro-luminescent element becomes the formation of the single-layer third interlayer insulation film 126. This feature allows a significant reduction in the step-difference in the through-hole portion 127.

Figure 7D:
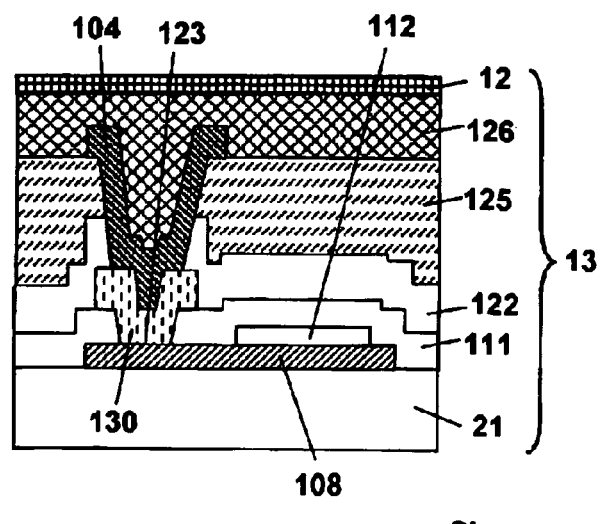
FIG. 7D is a cross-sectional view for explaining an application example of the organic electro-luminescent display apparatus according to the third embodiment of the present invention along the C-C'line in FIG. 5.
Figure 7E:
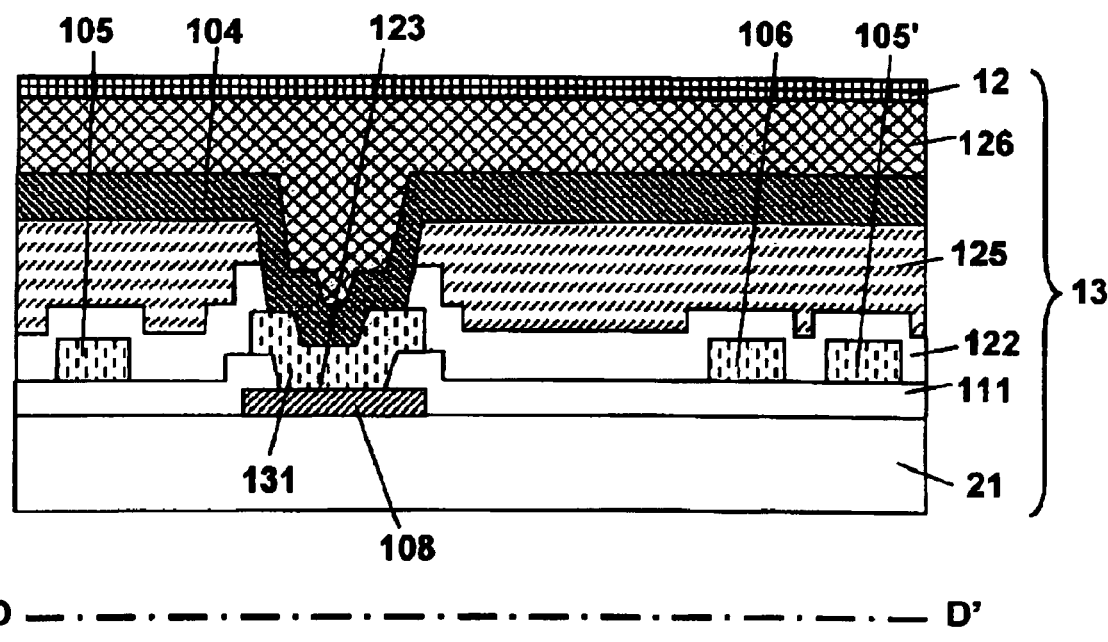
FIG. 7E is a cross-sectional view for explaining the application example of the organic electro-luminescent display apparatus according to the third embodiment of the present invention along the D-D'line in FIG. 5.

As illustrated in FIG. 7A and FIG. 7B, the connection portion between the gate electrode 108 of the first transistor 101 and the gate line 104 was apertured by superposing the through-hole 123 on the gate insulation film 111, the first interlayer insulation film 122, and the second interlayer insulation film 125. The through-hole 123 can be formed by individually aperturing the gate insulation film 111, the first interlayer insulation film 122, and the second interlayer insulation film 125 using the photolithography. It is also possible, however, that the multilayered film of the gate insulation film 111 and the second interlayer insulation film 125 be apertured in batch by using a dry etching method, where the through-hole pattern apertured in the first interlayer insulation film 122 having photosensitive property was employed as a mask. Otherwise, as illustrated in FIG. 7D and FIG. 7E, it is of curse possible to implement the following configuration when individually aperturing the gate insulation film 111 and the second interlayer insulation film 125 of the through-hole portion 123: A pad electrode 130, which was formed using the same material and the same step as those of the drain line 105, was provided in the through-hole portion 123. Then, the gate electrode 108 and the gate line 104 were connected to each other via this pad electrode 130. On account of this configuration, the surface damage onto the gate electrode 108, when the through-hole 123 was formed in the multilayered insulation film, can be reduced by the amount equivalent to the aperture in the first interlayer insulation film 122. Also, ensuring the normal taper configuration of the end portion of the through-hole 123 becomes easier as the through-hole formation becomes the formation in the single-layer insulation films 111 and 122.

Embodiment 4

Figure 8:
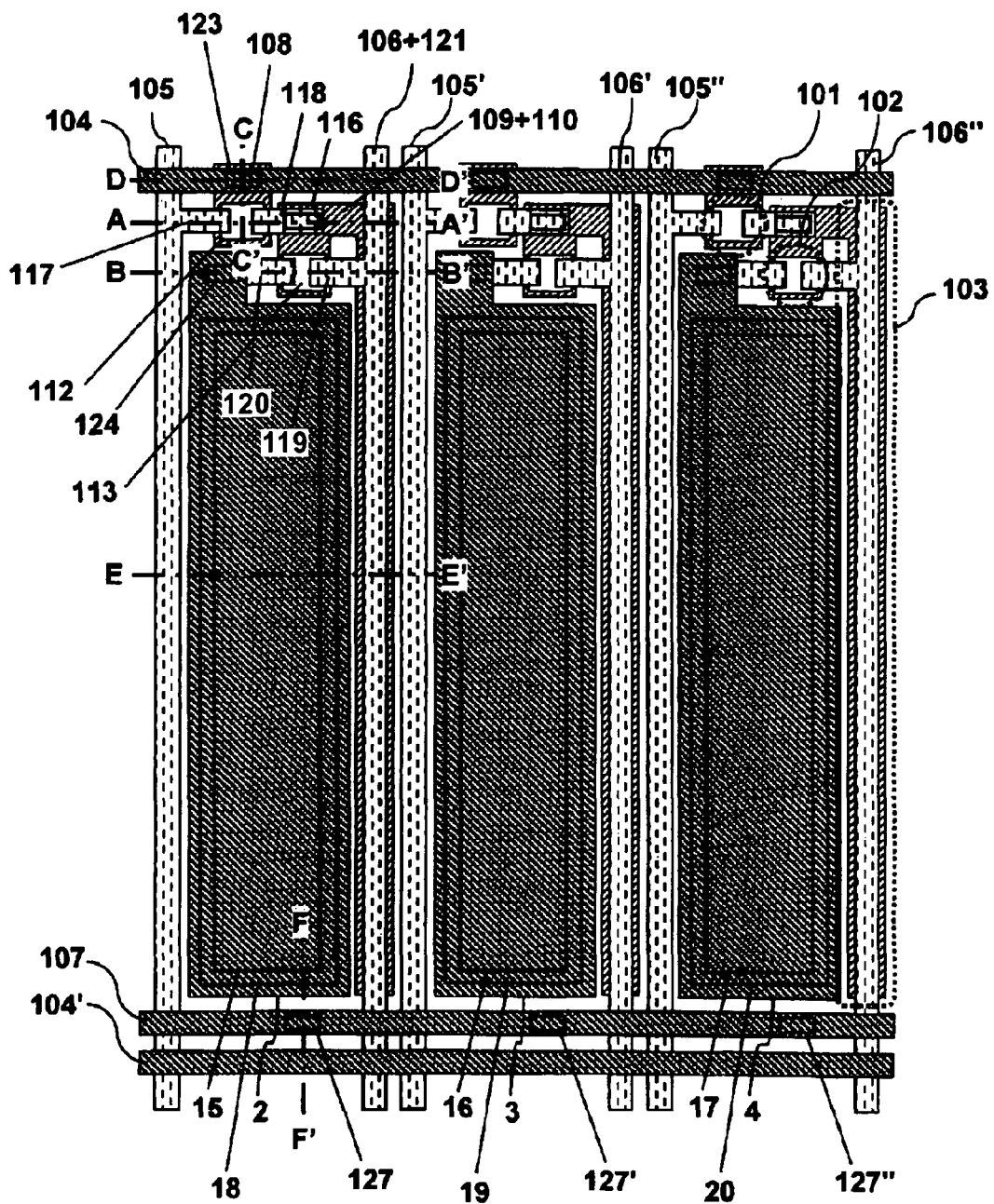
FIG. 8 is a plane view of one color pixel of an organic electro-luminescent display apparatus according to a fourth embodiment of the present invention.
Figure 9A:
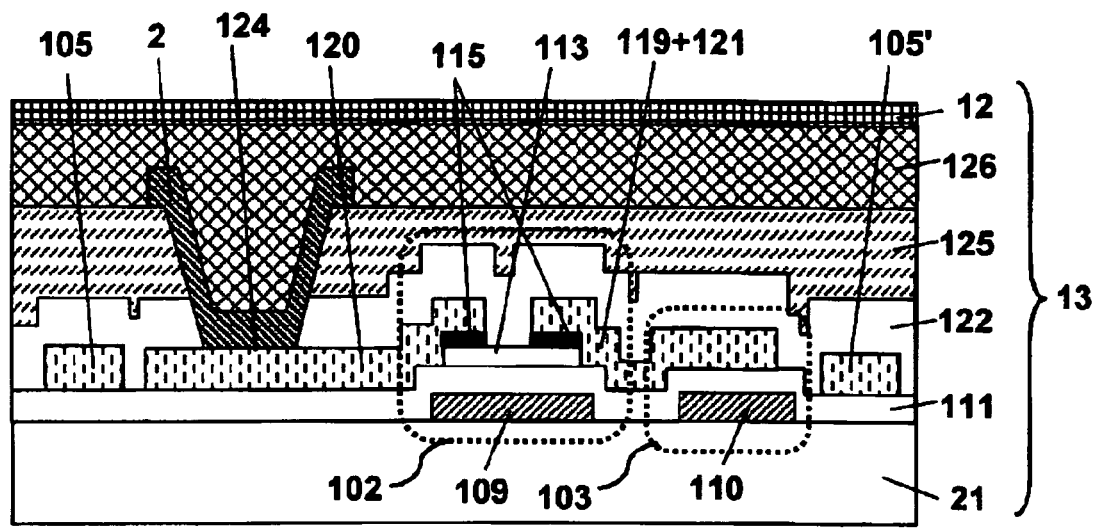
FIG. 9A is a cross-sectional view of the apparatus along the B-B' line in FIG. 8.
Figure 9B:
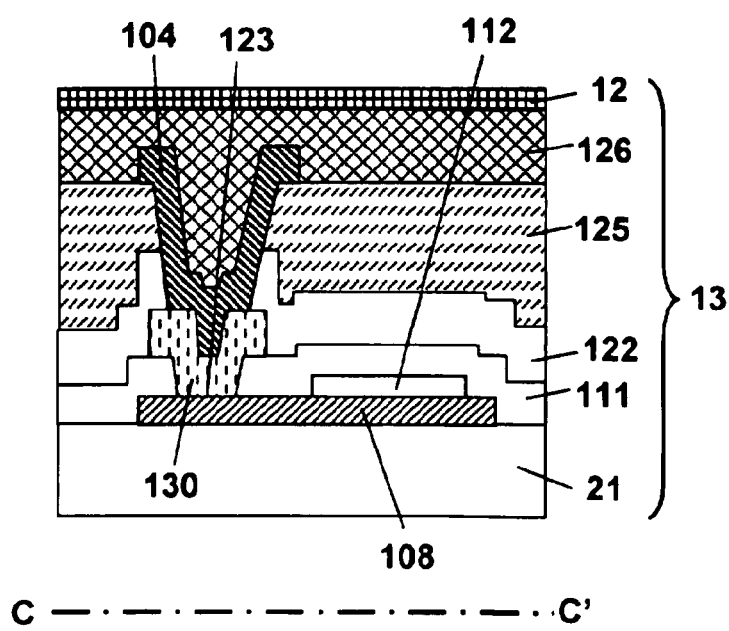
FIG. 9B is a cross-sectional view of the apparatus along the E-E' line in FIG. 8.
Figure 9C:
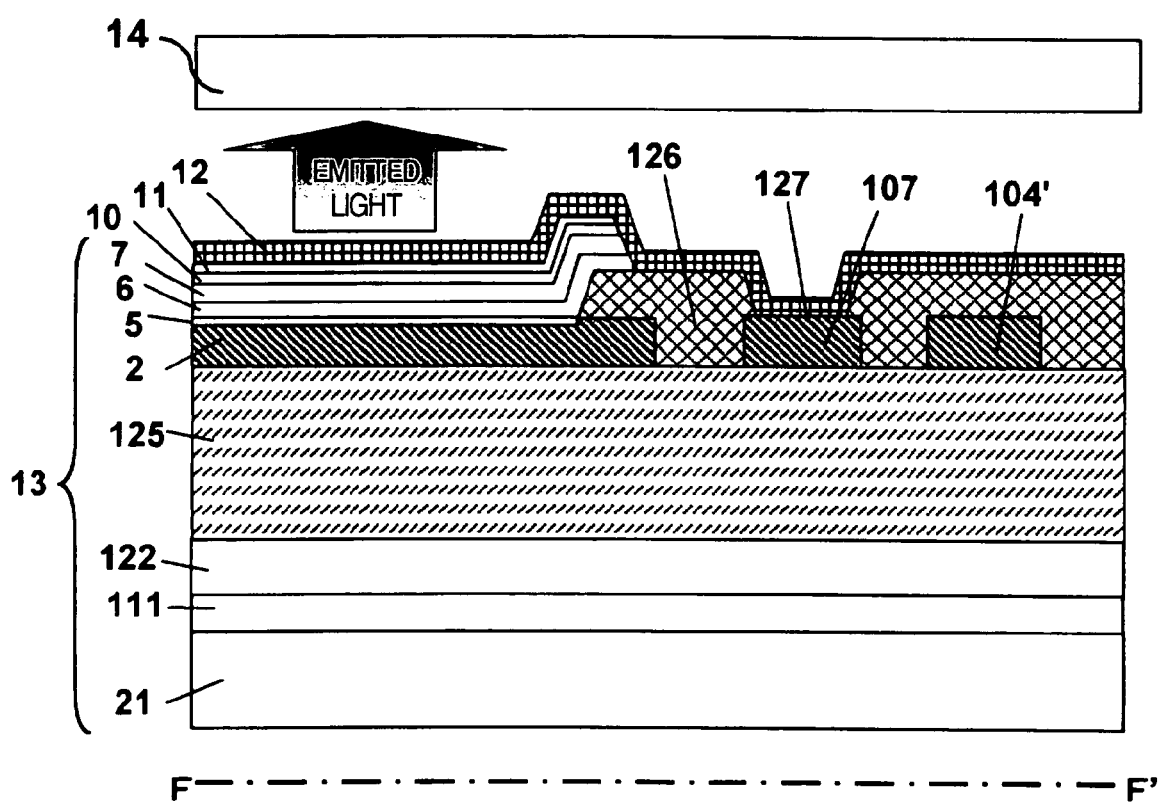
FIG. 9C is a cross-sectional view of the apparatus along the F-F' line in FIG. 8.

FIG. 8 is a plane view of one color pixel of an organic electro-luminescent display apparatus according to a fourth embodiment of the present invention. FIG. 9A is a cross-sectional view of the apparatus along a B-B' line. FIG. 9B is a cross-sectional view of the apparatus along an E-E' line. FIG. 9C is a cross-sectional view of the apparatus along an F-F' line. The cross-sectional views along an A-A' line, C-C' line, and D-D' line become the same as FIG. 6A, FIG. 6C, and FIG. 6D, respectively, and thus are omitted. The point which differs from the above-described first, second, and third embodiments is as follows: The gate line 104 of the present invention disposed at the upper layer as compared with the semiconductor layers 112 and 113, and the lower electrodes 2 to 4 of each organic electro-luminescent element were configured with the same layer and the same component. Based on this feature, while ensuring the heat-resistant property of the gate electrodes 108 and 109 of the present invention, and the low-resistance property of the gate line 104 of the present invention disposed at the upper layer as compared with the semiconductor layers 112 and 113, the gate line 104 was co-used with the configuration components of the lower electrodes 2 to 4. This co-use makes it possible to suppress an increase in the process on the line formation step and configuration components. In the present embodiment, moreover, the auxiliary line 107 of the upper transparent electrode 12, i.e., the second current supply line 107, was also co-used with the configuration component of the gate line 104. This feature also makes it possible to suppress an increase in the process and configuration components by the amount equivalent to the auxiliary line 107. In the present embodiment, the lower electrodes 2 to 4 of each organic electro-luminescent element were co-used with the low-resistance-line configuration components. As a result, it turns out that light is extracted not from the side of the lower electrodes 2 to 4, but from the side of the upper electrode 12. Accordingly, the present embodiment is limited to the application to the top-emission-type organic electro-luminescent display apparatus. Also, the surfaces of the lower electrodes 2 to 4 were configured using at least part of the low-resistance-line configuration components. Depending on the requirements, it is also possible to insert the hole injection layer 5 for enhancing the hole injection efficiency from the lower electrodes 2 to 4, i.e., the anodes, to the hole transport layer 6. In the present embodiment, the gate line 104 and the lower electrodes 2 to 4 were configured with a multilayered film of Mo and AlNd alloy. The film thickness of Mo was set at 50 nm, and the film thickness of the AlNd alloy was set at 400 nm. As the hole injection layer 5, a Mo oxide film was formed by applying plasma oxidation on the polar surface of the multilayered film.

Embodiment 5

Figure 10:
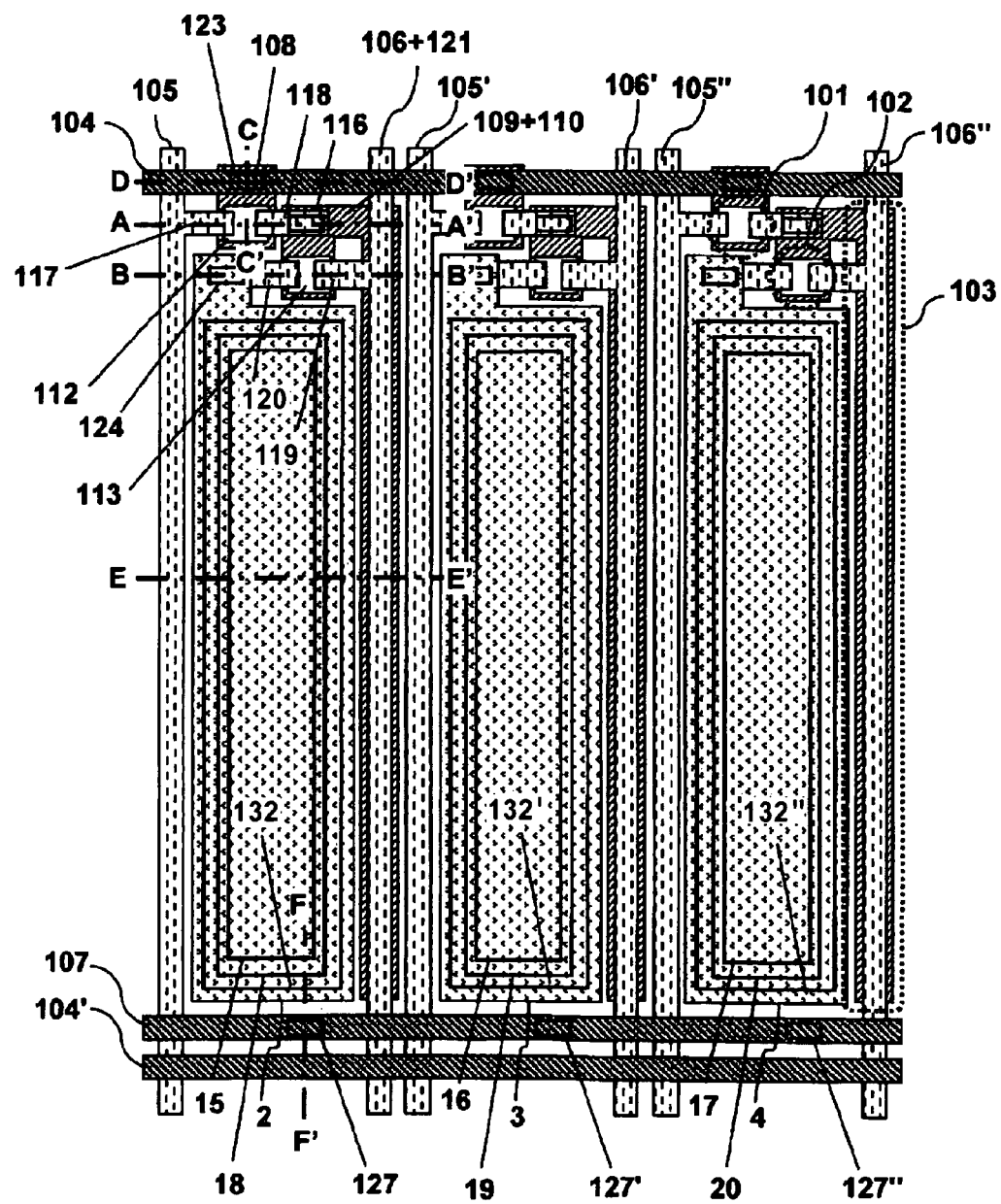
FIG. 10 is a plane view of one color pixel of an organic electro-luminescent display apparatus according to a fifth embodiment of the present invention.
Figure 11A:
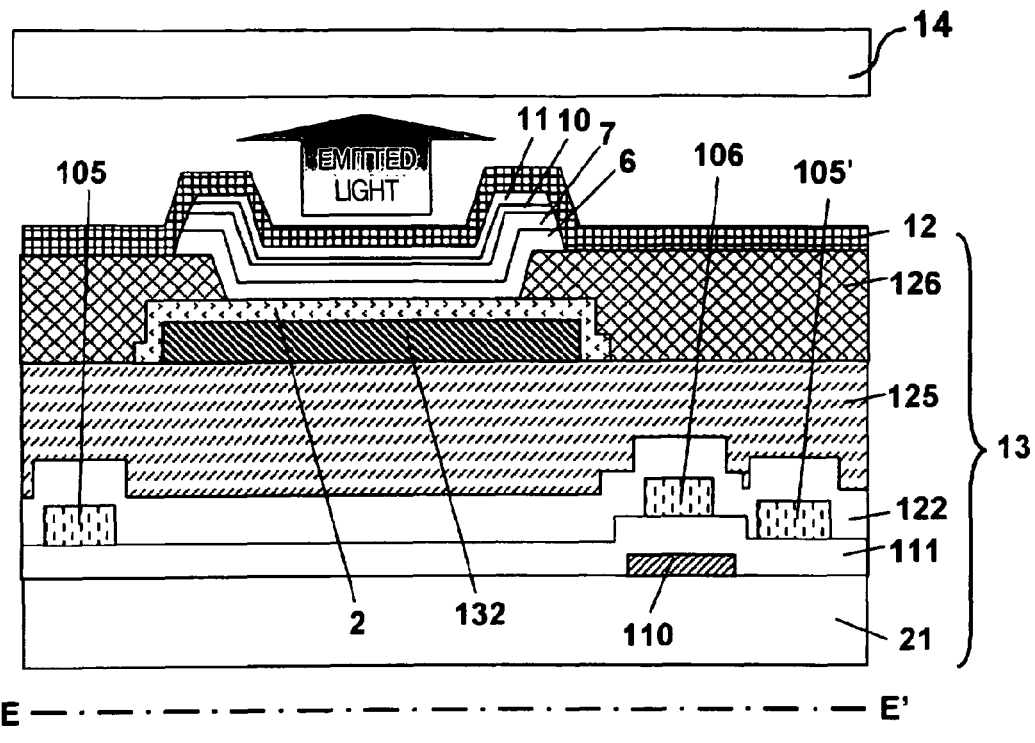
FIG. 11A is a cross-sectional view of the apparatus along the E-E' line in FIG. 10.
Figure 11B:
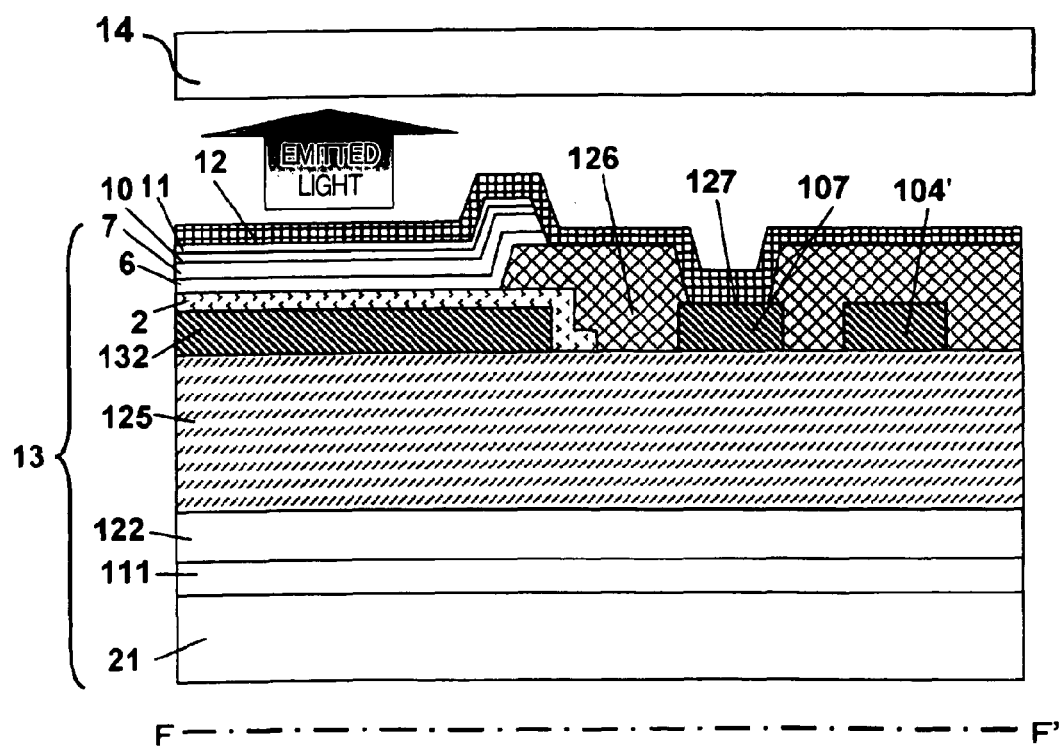
FIG. 11B is a cross-sectional view of the apparatus along the F-F' line in FIG. 10.

FIG. 10 is a plane view of one color pixel of an organic electro-luminescent display apparatus according to a fifth embodiment of the present invention. FIG. 11A is a cross-sectional view of the apparatus along an E-E' line. FIG. 11B is a cross-sectional view of the apparatus along an F-F' line. The cross-sectional views along an A-A' line, B-B' line, C-C' line, and D-D' line become the same as FIG. 6A, FIG. 6B, FIG. 6C, and FIG. 6D, respectively, and thus are omitted. The point which differs from the above-described first, second, third, and fourth embodiments is as follows: The gate line 104 of the present invention disposed at the upper layer as compared with the semiconductor layers 112 and 113, and a reflection film 132 provided under the lower electrodes 2 to 4 of each organic electro-luminescent element were configured with the same layer and the same component. Based on this feature, while ensuring the heat-resistant property of the gate electrodes 108 and 109 of the present invention, and the low-resistance property of the gate line 104 of the present invention disposed at the upper layer as compared with the semiconductor layers 112 and 113, the gate line 104 was co-used with the configuration component of the reflection film 132. This co-use makes it possible to suppress an increase in the process on the line formation step and configuration components.

In the present embodiment, the lower-electrode material can arbitrarily be selected with respect to the gate-line material. Accordingly, it becomes easier to adjust the work function on the electrode surfaces. This feature makes it possible to enhance the hole injection efficiency of each organic electro-luminescent element. In the present embodiment, moreover, the auxiliary line 107 of the upper transparent electrode 12, i.e., the second current supply line 107, was also co-used with the configuration component of the gate line 104. This feature also makes it possible to suppress an increase in the process and configuration components. In the present embodiment, the configuration becomes the one where the reflection film 132 was provided on the side of the lower electrodes 2 to 4 of each organic electro-luminescent element. As a result, similarly to the above-described fourth embodiment, the light is extracted from the side of the upper electrode 12, so that the present embodiment is limited to application to the top-emission-type organic electro-luminescent display apparatus. In the present embodiment, the gate line 104 and the reflection film 132 were configured with the multilayered film of Mo and AlNd alloy. The film thickness of Mo was set at 50 nm, and the film thickness of the AlNd alloy was set at 400 nm. The ITO film, whose work function is easier to adjust, was employed as the lower electrodes 2 to 4, i.e., the anodes. The film thickness of the ITO film was set at 130 nm. Although the work function of the ITO film is equal to about 4.6 eV, this work function can be increased up to about 5.2 eV by applying processings such as UV ozone illumination and oxygen plasma treatment. Each of the above-described films was formed using the sputtering method.

Figure 11C:
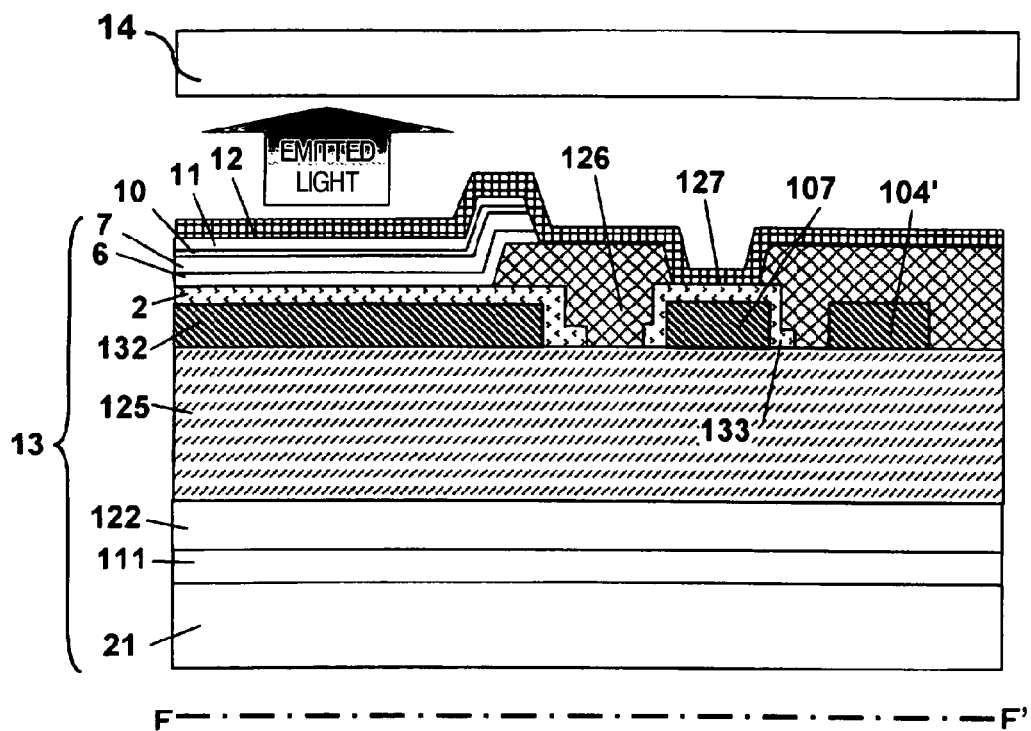
FIG. 11C is a cross-sectional view for explaining an application example of the organic electro-luminescent display apparatus according to the fifth embodiment of the present invention along the F-F' line in FIG. 10.

With respect to the connection portion between the second current supply line 107, i.e., the auxiliary line 107 of the upper electrode 12, and the upper electrode 12 of each organic electro-luminescent element, it is of curse possible to implement the following configuration: Namely, as illustrated in FIG. 11C, a pad electrode 133, which was formed using the same material and the same step as those of the lower electrodes 2 to 4, was provided in the connection portion. Then, the second current supply line 107 and the upper electrode 12 were connected to each other via this pad electrode 133. On account of this configuration, selective machining for the configuration material of the lower electrodes 2 to 4 becomes unnecessary on the second current supply line 107.

Figure 11D:
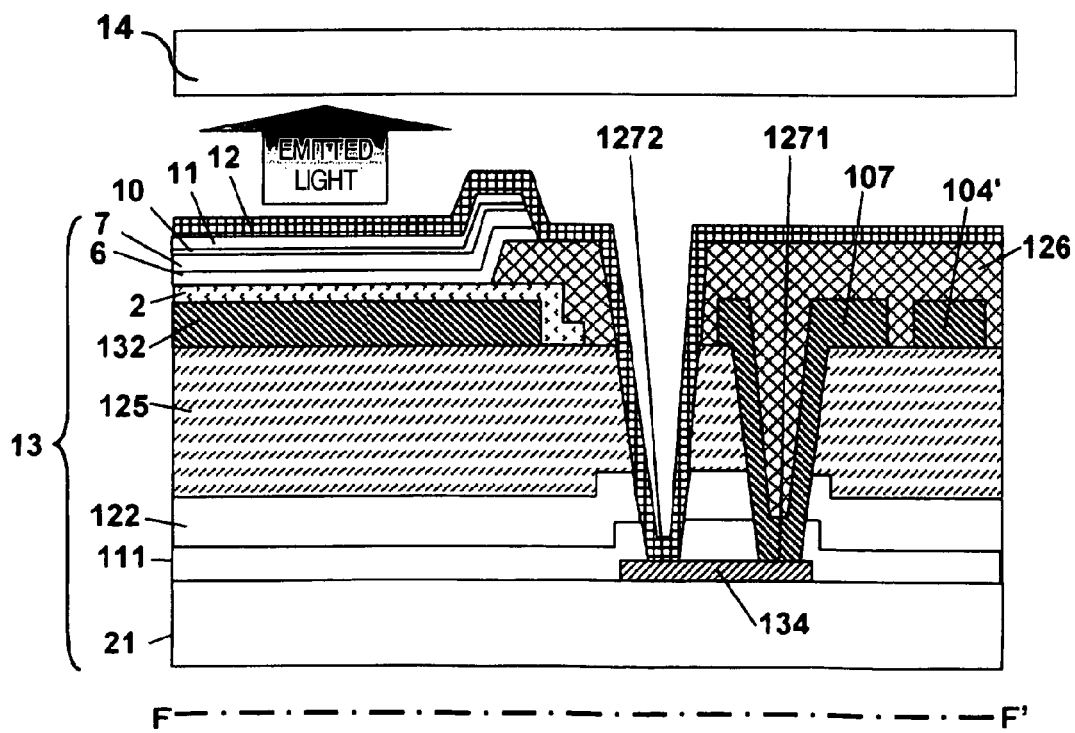
FIG. 11D is a cross-sectional view for explaining another application example of the organic electro-luminescent display apparatus according to the fifth embodiment of the present invention along the F-F' line in FIG. 10.

In the case where, like the present embodiment, the configuration components of the gate line 104, the reflection film 132, and the auxiliary line 107 were co-used with each other, it is necessary to satisfy the low-resistance property of the gate line 104, the reflection characteristics of the reflection film 132, and the contact characteristics between the auxiliary line 107 and the upper electrode 12. With respect to this necessity, the following configuration was given: Namely, as illustrated in FIG. 11D, a pad electrode 134, which was formed using the same material and the same step as those of the gate electrodes 108 and 109, was provided in the connection portion between the second current supply line 107 and the upper electrode 12 of each organic electro-luminescent element. Then, through-holes 1271 and 1272 were apertured on the pad electrode 134, and the second current supply line 107 and the upper electrode 12 were connected to each other via this pad electrode 134. On account of this configuration, the direct contact between the upper electrode 12 composed of a transparent electrically-conductive film such as ITO and the second current supply line 107 composed of the gate-line material becomes unnecessary. Accordingly, it becomes possible to select the configuration material in such a manner that priority is given to the characteristics of the gate line 104 and the reflection film 132. Specifically, it becomes possible to enhance the characteristics of the reflection film 132 by configuring the reflection film 132 with Al or Ag which is superior in the low-resistance property and the reflection characteristics, or an alloy film of these metals.

The material employable as the pad electrode 134 whose component was co-used with the gate electrodes 108 and 109 is a high-melting-point metal such as Mo, Ti, Ta, W, Nb, or Cr. These high-melting-point metals are superior in the contact characteristics with the transparent electrically-conductive film, and allow compatibility with the heat-resistant property. As one example, the gate line 104, the reflection film 132, and the auxiliary line 107 are formed of an AlSi alloy film, and the gate electrodes 108, 109, and the pad electrode 134 are formed of a CrMo alloy film. Additionally, for the pad electrode 134, ensuring the contact characteristics with the transparent electrically-conductive film is sufficient. Consequently, the pad electrode 134 can also be configured with the same layer and the same component as those of the drain line 105 in substitution for the gate electrodes 108 and 109.

Embodiment 6

Figure 12:
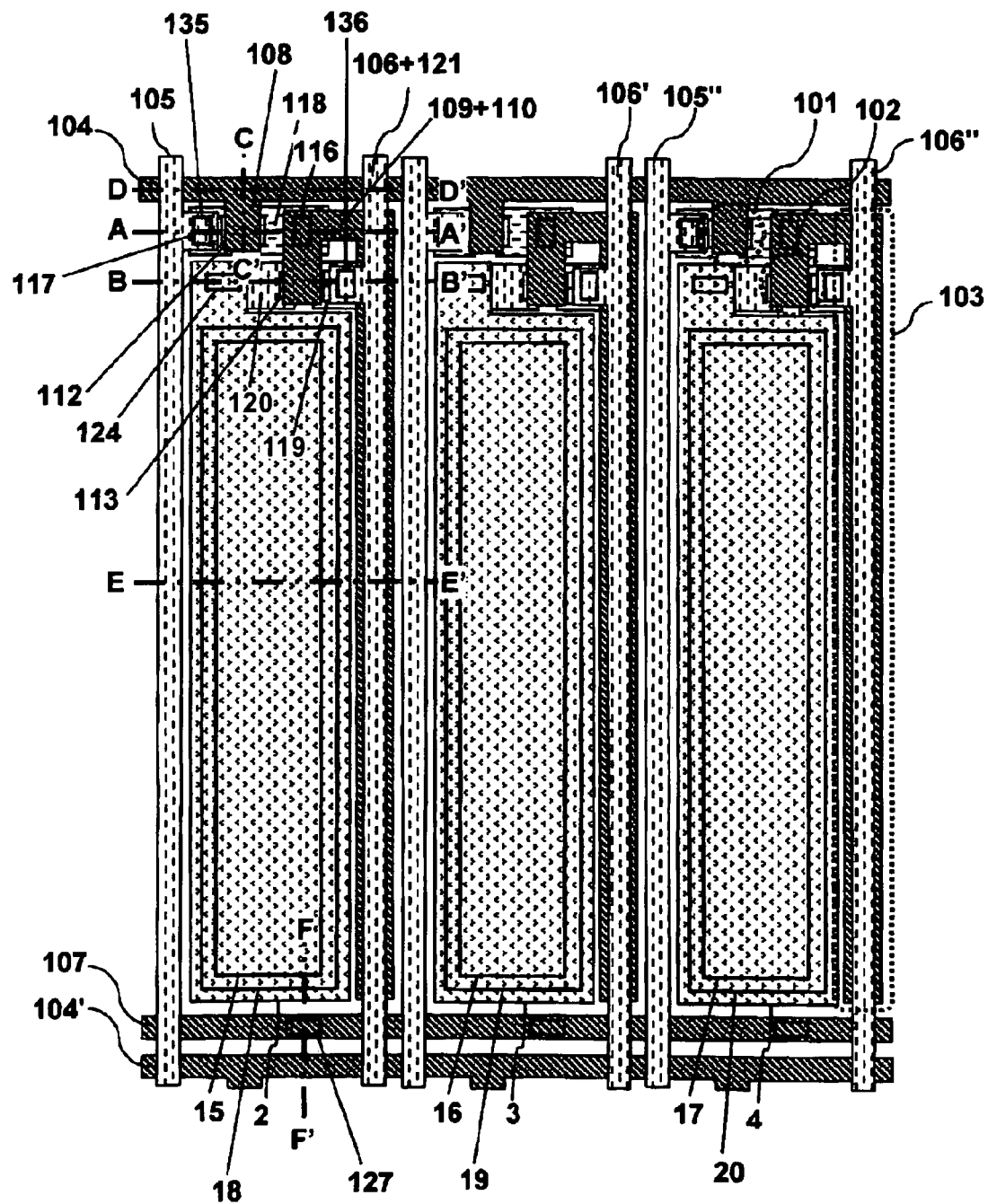
FIG. 12 is a plane view of one color pixel of an organic electro-luminescent display apparatus according to a sixth embodiment of the present invention.
Figure 13A:
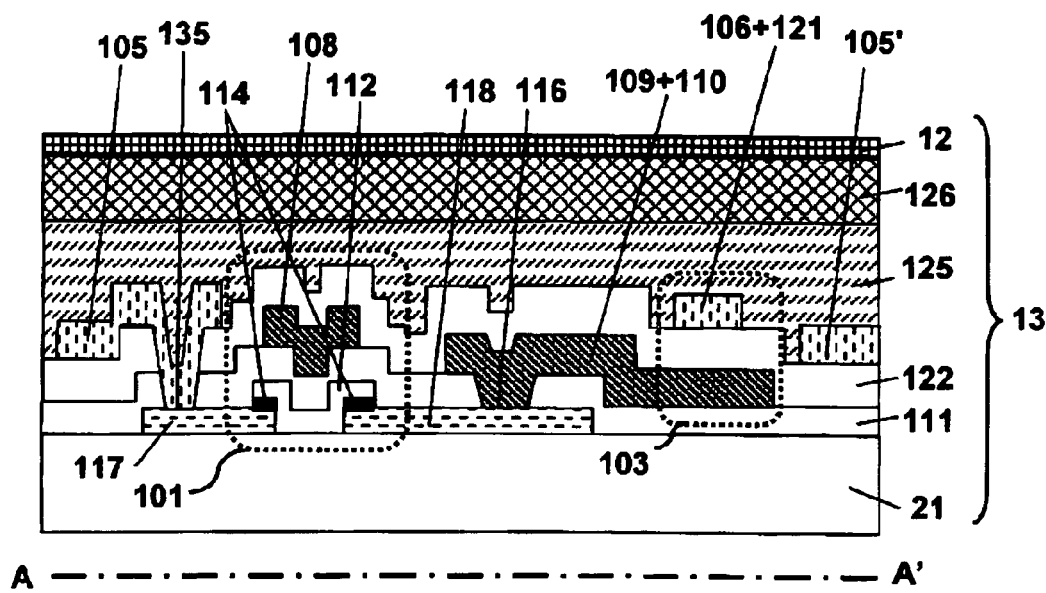
FIG. 13A is a cross-sectional view of the apparatus along the A-A' line in FIG. 12.
Figure 13B:
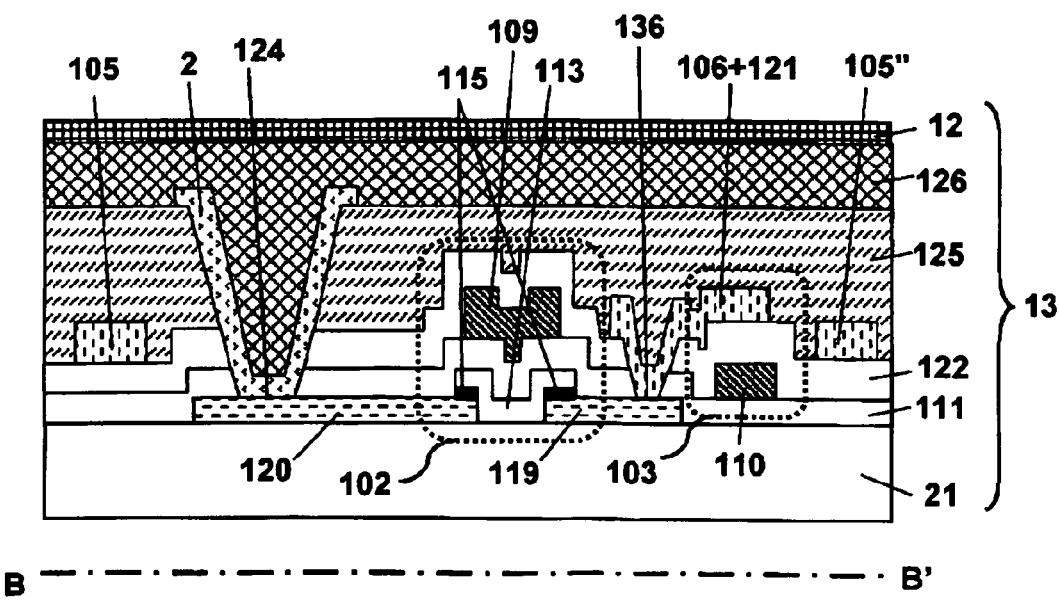
FIG. 13B is a cross-sectional view of the apparatus along the B-B' line in FIG. 12.
Figure 13C:
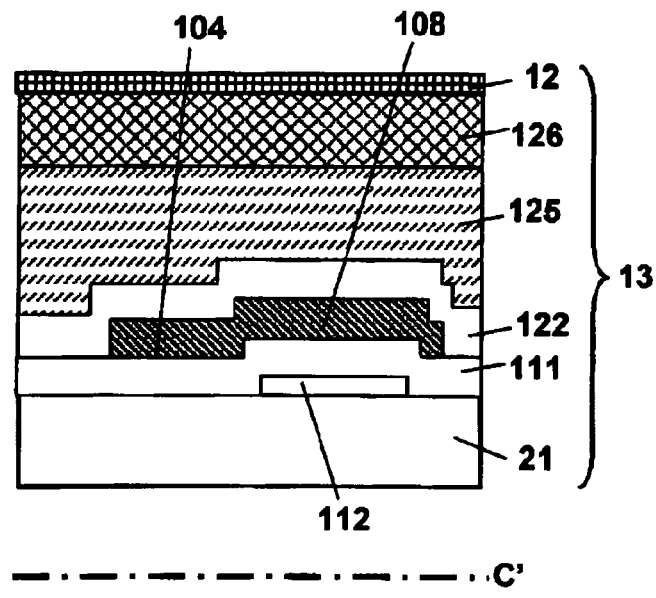
FIG. 13C is a cross-sectional view of the apparatus along the C-C' line in FIG. 12.
Figure 13D:
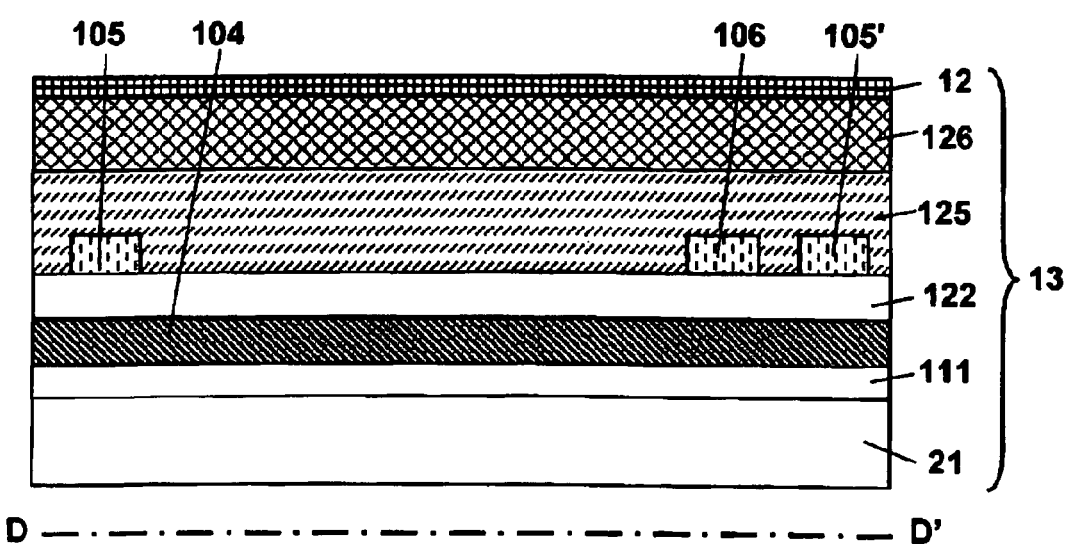
FIG. 13D is a cross-sectional view of the apparatus along the D-D' line in FIG. 12.
Figure 13E:
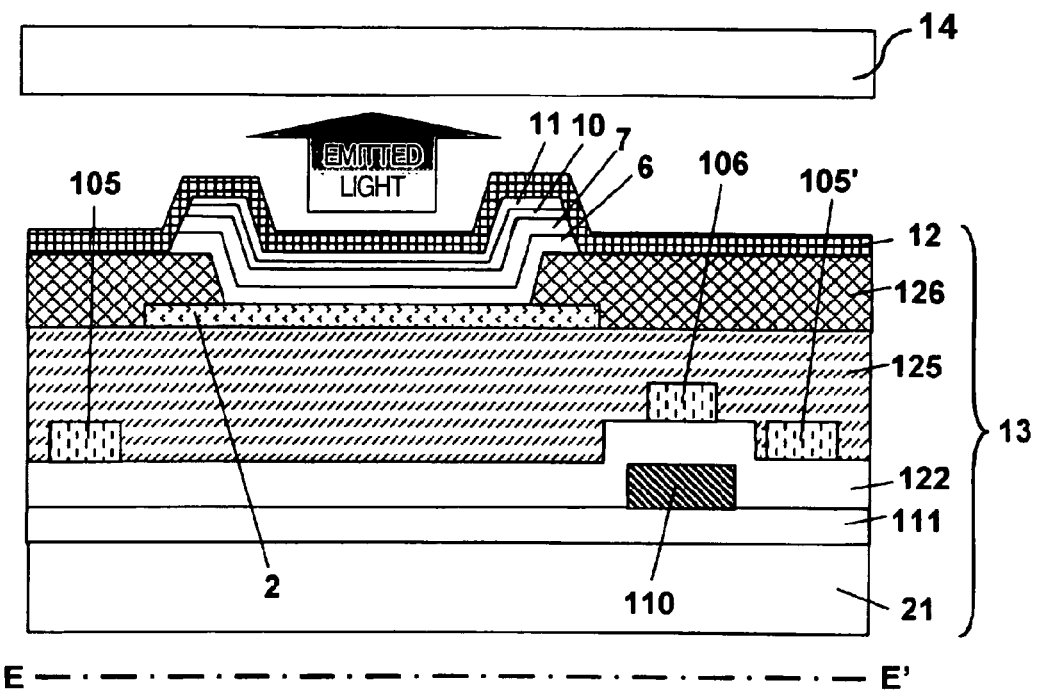
FIG. 13E is a cross-sectional view of the apparatus along an E-E' line in FIG. 12.
Figure 13F:
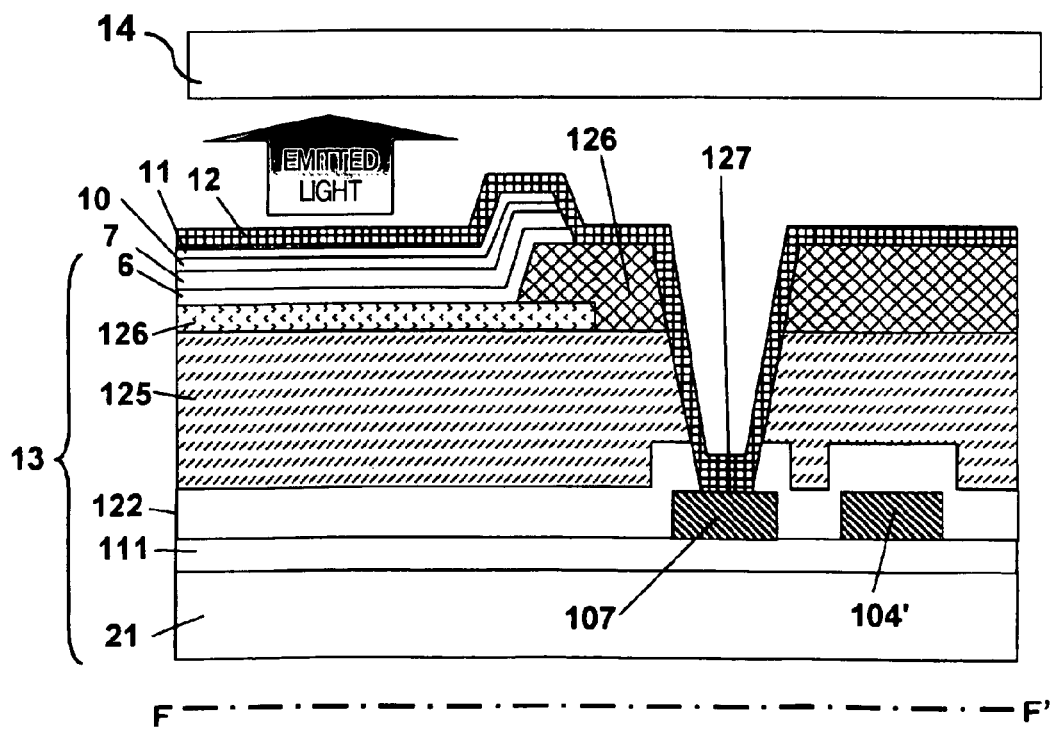
FIG. 13F is a cross-sectional view of the apparatus along the F-F' line in FIG. 12.

FIG. 12 is a plane view of one color pixel of an organic electro-luminescent display apparatus according to a sixth embodiment of the present invention. FIG. 13A is a cross-sectional view of the apparatus along an A-A' line. FIG. 13B is a cross-sectional view of the apparatus along a B-B' line. FIG. 13C is a cross-sectional view of the apparatus along a C-C' line. FIG. 13D is a cross-sectional view of the apparatus along a D-D' line. FIG. 13E is a cross-sectional view of the apparatus along an E-E'line. FIG. 13F is a cross-sectional view of the apparatus along an F-F' line. The point which differs from the above-described first to fifth embodiments is as follows: Namely, the regular-stagger-type TFT structure was employed as the first transistor 101 and the second transistor 102, having the following configuration: In each TFT, the source and drain electrodes were disposed at the lower layer as compared with the semiconductor layer that forms the channel of each TFT. Moreover, the drain line was disposed at the upper layer which is upper as compared with the semiconductor layer, the drain line being composed of a material that is different from a material of which the source and drain electrodes were composed. The source and drain electrodes and the drain line were connected to each other via a through-hole which was bored in the insulation film. Specifically, as illustrated in FIG. 13A, via a through-hole 135 which was bored in the gate insulation film 111 and the first interlayer insulation film 122, the source electrode 117 of the first transistor 101, which was formed at the lower layer as compared with the semiconductor layers 112 and 113 that form the channels, was connected to the signal line 105, i.e., the drain line 105 disposed at the upper layer as compared with the semiconductor layers 112 and 113.

The setting of the above-described configuration allows employment of the following configuration: Namely, even in the case where the polycrystalline-Si film which necessitates the high-temperature formation was applied to the semiconductor layers 112 and 113 of the regular-stagger-type TFTs 101 and 102, the source electrodes 117 and 119 and the drain electrodes 118 and 120, which were disposed at the lower layer as compared with the semiconductor layers 112 and 113, can be formed by using a high-heat-resistant material which is capable of resisting the high temperature at the time of the polycrystalline-Si film formation. Simultaneously, independently of this employment of the high-heat-resistant material, the drain line 105, which was disposed at the upper layer as compared with the semiconductor layers 112 and 113, and which was not exposed to the high temperature at the time of the polycrystalline-Si film formation, can be formed by using a low-resistance material. The configuration materials employable as the source electrodes 117 and 119 and the drain electrodes 118 and 120 in the regular-stagger-type TFTs 101 and 102 of the present invention are, specifically, the gate-electrode configuration materials for the inverted-stagger-type TFTs of the present invention described in the above-described first embodiment. The configuration materials employable as the drain line 105 are, similarly, the gate-line configuration materials for the inverted-stagger-type TFTs.

Meanwhile, as illustrated in FIG. 13A and FIG. 13B, the drain electrode 118 of the first transistor 101 was connected to the gate electrode 109 of the second transistor 102 and the lower electrode 110 of the capacitor 103. The drain electrode 120 of the second transistor 102 was connected to the upper electrode 121 of the capacitor 103 and the first current supply line 106. The source electrode 119 of the second transistor 102 was connected to the lower electrode 2 of each organic electro-luminescent element. As illustrated in FIG. 13C, the gate electrode 108 of the first transistor 101 was connected on its extended line to the scanning line 104, i.e., the gate line 104. Also, as illustrated in FIG. 13D, the gate line 104, the drain line 105 of the present invention disposed at the upper layer, and the first current supply line 106 were intersected in a matrix-like configuration with the gate insulation film 111 placed therebetween.

Next, the explanation will be given below concerning a fabrication method for the organic electro-luminescent element portion based on the above-described configuration. First, as illustrated in FIG. 13A to FIG. 13F, electrode films for the source electrodes 117 and 119 and the drain electrodes 118 and 120 according to the present invention were formed on the glass substrate 116. As described earlier, the materials applicable to the source and drain electrodes are the high-melting-point metals, or an alloy of these metals, or a multi-layered film of these metals, or the Al alloy having the heat-resistant property, or the oxide transparent electrically-conductive films. These films can be formed using the sputtering method. In the present embodiment, Cr was employed, and the film thickness was set at 80 nm.

Next, as illustrated in FIG. 13A and FIG. 13B, on these source and drain electrode films, $p^+$ Si films, which become the dope layers 114 and 115 that are contact layers, were formed using the plasma CVD method. The film thickness was set at 30 nm. Additionally, the polarity for the dope layers 114 and 115 is not limited to the $p^+$ Si films, but can be changed arbitrarily to $n^+$ Si films depending on the TFT configuration of the pixel circuit. After the above-described formation, the source-electrode patterns 117 and 119 and the drain-electrodes patterns 118 and 120 were formed in batch for each $p^+$ Si film at the upper layer, using photolithography.

Next, as illustrated in FIG. 13A and FIG. 13B, as the semiconductor layers 112 and 113, the polycrystalline-Si films were formed on the dope layers 114 and 115 and at 450° C. high substrate temperature, using the reaction-heat CVD method which employs a combination of $GeF_4$ and $Si_2H_6$ as the reaction gas. The film thickness was set at 100 nm. After that, multilayered films of the $p^+$ Si films 114 and 115, i.e., the dope layers, and the semiconductor layers 112 and 113 were machined in batch into an island-like configuration, using photolithography. On account of this, the contact layers 114 and 115 were formed by removing the $p^+$ Si films on the source electrodes 117 and 119 and the drain electrodes 118 and 120 where contact portions with the semiconductor layers 112 and 113 are excluded.

Next, the gate insulation film 111 was formed on the semiconductor layers 112 and 113, and the source electrodes 117 and 119 and the drain electrodes 118 and 120. The materials employable as the gate insulation film 111 are $SiO_2$, SiN, and the like. These films can be formed using the plasma CVD method, sputtering method, and the like. Otherwise, the plasma oxidation, optical oxidation, and the like may be used simultaneously. In the present embodiment, a $SiO_2$ film formed by the plasma CVD method using TEOS was employed. The film thickness was set at 150 nm.

Next, as illustrated in FIG. 13A, the through-hole 116 for connecting the drain electrode 118 of the first transistor 101 with the gate electrode 109 of the second transistor 102 was formed in the gate insulation film 111 over the drain electrode 118 of the first transistor 101.

Next, as illustrated in FIG. 13A to FIG. 13E, the gate electrodes 108, 109, the gate line 104, the lower electrode 110 of the capacitor 103, and the second current supply line 107 which becomes the auxiliary line for the upper electrode 12 of each organic electro-luminescent element, were formed on the gate insulation film 111. The materials employable as these components are the low-resistance metals such as Al, Cu, or Ag, or an alloy of these metals, or a multilayered film containing these metals. This is because the semiconductor layers 112 and 113 have been formed already, and thus the upper-limit temperature can be lowered. In the present embodiment, a Mo/AlNd-alloy/Mo multilayered film was formed using the sputtering method, considering compatibility with the contact characteristics. The film thicknesses were set at 40/400/40 nm. Next, the machining into the gate-electrodes patterns 108, 109, the gate-line pattern 104, the lower-electrode pattern 110 of the capacitor 103, and the second current supply line pattern 107 was performed using the photolithography.

Next, using the plasma CVD method, a SiN film was formed as the first interlayer insulation film 122 on the gate electrodes 108, 109 and the gate line 104. The film thickness was set at 500 nm.

Next, as illustrated in FIG. 13A and FIG. 13B, a through-hole 135 for connecting the source electrode 117 of the first transistor 101 with the drain line 105, and a through-hole 136 for connecting the source electrode 119 of the second transistor 102, the upper electrode 121 of the capacitor 103, and the first current supply line 106 were formed into the multi-layered film of the gate insulation film 111 and the first interlayer insulation film 122.

Next, as illustrated in FIG. 13A, FIG. 13B, FIG. 13D, and FIG. 13E, the drain line 105 and the first current supply line 106 according to the present invention were formed on these through-holes. As described earlier, ensuring the heat-resistant property becomes unnecessary as the drain-line material. As a result, the low-resistance metal such as Al, Cu, or Ag, or an alloy of these metals, or a multilayered film containing these metals becomes employable as the drain-line material. This feature makes it easy to ensure the low-resistance drain line even when the high-temperature formation of the semiconductor layers 112 and 113 was performed. In the present embodiment, a Mo/AlNd-alloy multilayered film was employed, considering compatibility with the contact characteristics. The film thickness of Mo was set at 50 nm, and the film thickness of the AlNd alloy was set at 400 nm. Next, the machining into the drain-line pattern 105 and the first current supply line 106 was performed using the photolithography.

Next, as illustrated in FIG. 13B and FIG. 13F, the through-hole 124 for connecting the drain electrode 120 of the second transistor 102 with the lower electrode 2 of each organic electro-luminescent element, and the through-hole 127 for connecting the second current supply line 107 with the upper electrode 12 of each organic electro-luminescent element were formed into the gate insulation film 111 and the first interlayer insulation film 122.

Next, employing a 2 μm thick photosensitive acrylic insulation film, the second interlayer insulation film 125 was formed on the through-holes as a component which serves as an interlayer insulation film for coating the entire surface of the drain line 105 and the first current supply line 106 to insulate them from the organic electro-luminescent element portion, as well as the planarization film for forming each organic electro-luminescent element. As illustrated in FIG. 13B and FIG. 13F, the through-hole portion 124 for connecting the drain electrode 120 of the second transistor 102 with the lower electrode 2 of each organic electro-luminescent element, and the through-hole portion 127 for connecting the second current supply line 107 with the upper electrode 12 of each organic electro-luminescent element were formed such that the aperture portions were overlapped with each other, using the photolithography which utilizes the photosensitive property of the acrylic insulation film.

Next, as illustrated in FIG. 13B, FIG. 13E, and FIG. 13F, a 150 nm thick Cr film was formed on the second interlayer insulation film using the sputtering method, then forming the lower electrode 2 of each organic electro-luminescent element using the photolithography. As illustrated in FIG. 13B, the lower electrode 2 was connected to the drain electrode 120 of the second transistor 102 via the through-hole 124.

Next, as illustrated in FIG. 12, FIG. 13E, and FIG. 13F, a 2 μm thick photosensitive acrylic insulation film was formed on the lower electrode 2 as the third interlayer insulation film 126, i.e., the bank insulation film. Specifically, the third interlayer insulation film 126 was formed such that portions which were positioned inside by 3 μm from pattern end portions of the lower electrodes 2 to 4 were coated excluding the pixel aperture portions 15 to 17, and using the photolithography which utilizes the photosensitive property of the acrylic insulation film. At the same time, as illustrated in FIG. 13B and FIG. 13F, the through-hole portion 124 for connecting the drain electrode 120 of the second transistor 102 with the lower electrode 2 of each organic electro-luminescent element, and the through-hole portion 127 for connecting the second current supply line 107 with the upper electrode 12 of each organic electro-luminescent element were formed such that the aperture portions were overlapped with each other. The subsequent fabrication method for the organic electro-luminescent element portion and assembly method for the organic electro-luminescent display apparatus are basically the same as those in the above-described first embodiment, and thus will be omitted.

Figure 13G:
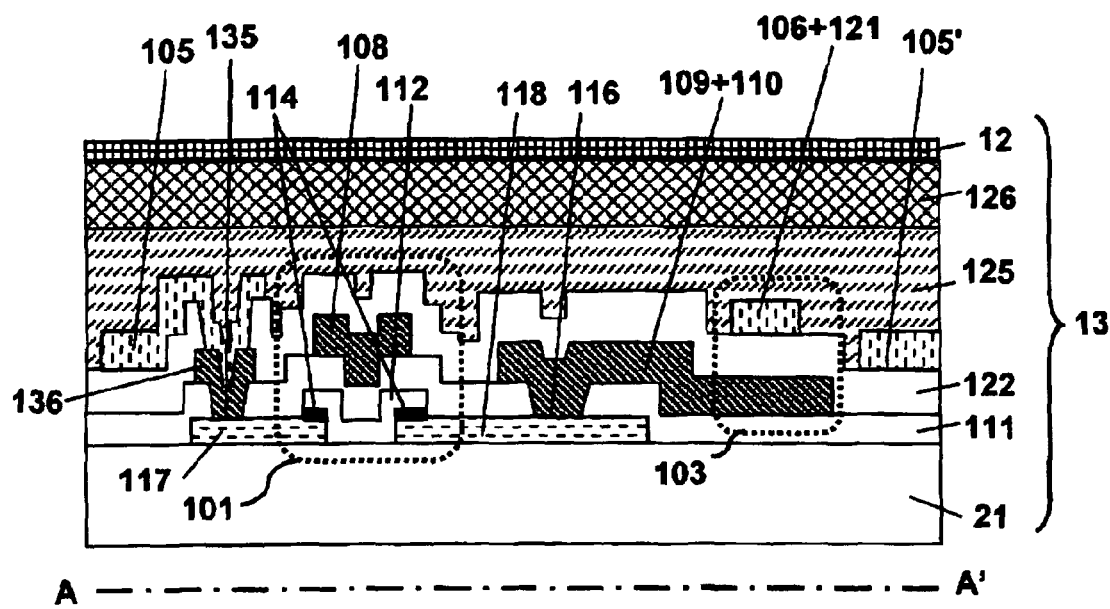
FIG. 13G is a cross-sectional view for explaining an application example of the organic electro-luminescent display apparatus according to the sixth embodiment of the present invention along the A-A'line in FIG. 12.

In the above-described sixth embodiment, as illustrated in FIG. 13G, the following configuration is also possible: A pad electrode 136, which was formed using the same material and the same step as those of the gate electrodes 108 and 109 and the gate line 104, was provided in the through-hole 135 for connecting the source electrode 117 of the first transistor 101 with the drain line 105. Then, the source electrode 117 and the drain line 105 were connected to each other via this pad electrode 136. On account of this configuration, the surface damage on the source electrode 117, when the through-hole 135 was formed in the multilayered insulation film, can be reduced by the amount equivalent to the aperture in the second interlayer insulation film 125.

Figure 13H:
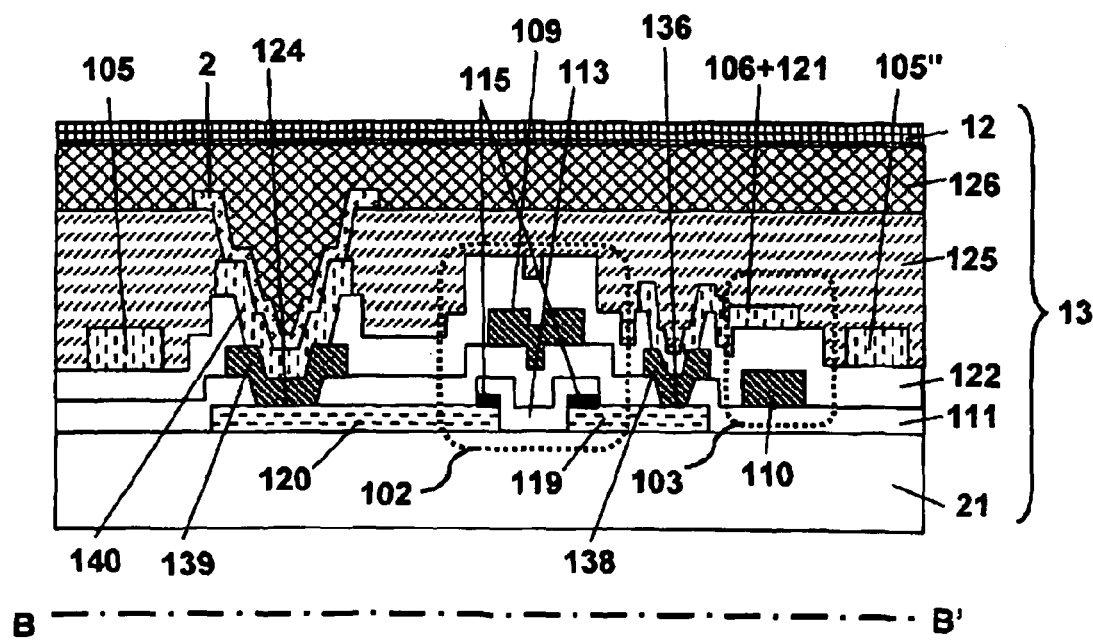
FIG. 13H is a cross-sectional view for explaining an application example of the organic electro-luminescent display apparatus according to the sixth embodiment of the present invention along the B-B'line in FIG. 12.

Similarly, as illustrated in FIG. 13H, the following configuration is also possible: A pad electrode 139, which was formed using the same material and the same step as those of the gate electrodes 108 and 109 and the gate line 104, and a pad electrode 140, which was formed using the same material and the same step as those of the drain line 105, were provided in the through-hole portion 124 for connecting the drain electrode 120 of the second transistor 102 with the lower electrode 2 of each organic electro-luminescent element. Then, the drain electrode 120 and the lower electrode 2 were connected to each other via these pad electrodes 139 and 140. On account of this configuration, the formation step of the through-hole 124 in the multilayered insulation film can be divided into a plurality of times. Accordingly, the surface damage on the drain electrode 120, when the through-hole 124 was formed in the multilayered insulation film, can be reduced by the amount equivalent to the aperture into the first interlayer insulation film 122, and by the amount equivalent to the aperture into the second interlayer insulation film 125. Also, in the through-hole aperture portion in the gate insulation film 122, the selective machining for the configuration material of the drain electrode 120, the configuration materials of the gate electrodes 108 and 109 and the gate line 104, and further, the configuration material of the drain electrode 120 and the configuration material of the drain line 105 becomes unnecessary, thereby the degree of selection allowance for these configuration materials can be enhanced.

In the above-described sixth embodiment, the explanation has been given concerning the application examples to the regular-stagger-type TFT structure. Similarly to the inverted-stagger-type TFT structure explained in the above-described first to fifth embodiments, however, the following configuration may also be employable with respect to the insulation film for coating the surface of the drain line 105 disposed at the upper layer as compared with the semiconductor layers 112 and 113. Namely, the insulation film was co-used not only with the second interlayer insulation film 125 provided under each organic electro-luminescent element for implementing the pixel planarization, but also with the bank insulation film 126 provided for separating the electro-luminescent portions of the organic electro-luminescent elements on each pixel basis. Namely, the insulation film disposed at the upper layer was co-used with the insulation-film configuration components of each organic electro-luminescent element. This co-use makes it possible to suppress an increase in the process on the insulation-film formation step and configuration components.

Also, similarly to the above-described first to fifth embodiments, the drain line 105 disposed at the upper layer as compared with the semiconductor layers 112 and 113 can also be configured with the same layer and the same component as the lower electrodes 2 to 4 of each organic electro-luminescent element, or with the same layer and the same component as the reflection film provided under the lower electrodes 2 to 4 of each organic electro-luminescent element, or with the same layer and the same component as the auxiliary line 107 connected to the upper electrode 12 of each organic electro-luminescent element. Namely, the line disposed at the upper layer was co-used with the electrode and line configuration components of each organic electro-luminescent element. This co-use makes it possible to suppress an increase in the process on the line formation step and configuration components.

In the above-described respective embodiments, the explanation has been given concerning the application examples to the pixel driving circuit. The present invention, however, is not limited thereto. Namely, the present invention is applicable to whatever driving circuit, as long as it is a driving circuit whose configuration elements are the thin film transistors (TFTs). For example, it is applicable to peripheral circuits of the insulation substrate of each organic electro-luminescent element which configures the organic electro-luminescent display apparatus. In any cases, applying the present invention makes it possible to provide the organic electro-luminescent display apparatus which is advantageous from the cost-based viewpoint as well as the performance-based viewpoint.

It should be further understood by those skilled in the art that although the foregoing description has been made on the embodiments of the invention, the invention is not limited thereto and various changes and modifications may be made without departing from the spirit of the invention and the scope of the appended claims.

The invention claimed is:

1. An organic electro-luminescent display apparatus, provided with a plurality of pixels arranged in a matrix configuration, each of which is configured with an organic electro-luminescent element having a structure in which an organic electro-luminescent layer is sandwiched between an upper electrode and a lower electrode, and provided with TFTs for driving each of said pixels, comprising:
    each of said TFTs being an inverted-stagger-type TFT in which a gate electrode, an insulation film, a semiconductor layer, and source/drain electrodes are disposed in this sequence on an insulation substrate;
    each of said TFTs having a gate line connected to said gate electrode, and a drain line connected to said source/drain electrodes;
    said gate electrode being disposed at a lower layer as compared with said semiconductor layer forming a channel of each of said TFTs;
    said gate line being disposed at an upper layer as compared with said semiconductor layer, said gate line being composed of a material that is different from a material of which said gate electrode is composed; and
    said gate electrode and said gate line being connected to each other via a through-hole which is bored in said insulation film.

2. The organic electro-luminescent display apparatus according to claim 1, wherein
    said source/drain electrodes and said drain line of each of said TFTs are disposed at an upper layer as compared with said semiconductor layer,
    said gate line disposed at said upper layer as compared with said semiconductor layer is disposed at a more upper layer as compared with said source/drain electrodes and said drain line with an interlayer insulation film placed therebetween,
    and a top surface of said gate line is coated with an insulation film except for a terminal portion of said gate line which becomes a connection portion with an external circuit, said insulation film being provided at a more upper layer as compared with said gate line.

3. The organic electro-luminescent display apparatus according to claim 1, wherein
    an interlayer insulation film is provided on said gate line for planarizing each organic electro-luminescent element, and serves as said insulation film provided on said gate line.

4. The organic electro-luminescent display apparatus according to claim 1, wherein
    a bank layer for separating said electro-luminescent portions of the organic electro-luminescent elements on each pixel is provided on said gate line, and said bank layer is also serving as said insulation film provided on said gate line.

5. The organic electro-luminescent display apparatus according to claim 1, wherein
    said gate line is disposed at a layer which is identical to that of said lower electrode of each organic electro-luminescent element, and
    said gate line is formed using a material which is identical to at least part of a component that configures said lower electrode.

6. The organic electro-luminescent display apparatus according to claim 1, wherein
a reflection film is provided under said lower electrode of each organic electro-luminescent element, said gate line is disposed at a layer which is identical to that of said reflection film, and
said gate line is formed using a material which is identical to at least part of a component that configures said reflection electrode.

7. The organic electro-luminescent display apparatus according to claim 1, wherein
an auxiliary line is provided and is connected to said upper electrode of each organic electro-luminescent element, said gate line is disposed at a layer which is identical to that of said auxiliary line, and
said gate line is formed using a material which is identical to at least part of a component that configures said auxiliary line of said upper electrode.

8. An organic electro-luminescent display apparatus, provided with a plurality of pixels arranged in a matrix configuration, each of which is configured with an organic electro-luminescent element having a structure in which an organic electro-luminescent layer is sandwiched between an upper electrode and a lower electrode, and provided with TFTs for driving each of said pixels, comprising:
each of said TFTs being a regular-stagger-type TFT in which source/drain electrodes, a semiconductor layer, an insulation film, and a gate electrode are disposed in this sequence on an insulation substrate;
each of said TFTs having a gate line connected to said gate electrode, and a drain line connected to said source/drain electrodes;
said source/drain electrodes being disposed at a lower layer as compared with said semiconductor layer forming a channel of each of said TFTs;
said drain line being disposed at an upper layer as compared with said semiconductor layer, said drain line being composed of a material that is different from a material of which said source/drain electrodes is composed; and
said source/drain electrodes and said drain line being connected to each other via a through-hole which is bored in said insulation film.

9. The organic electro-luminescent display apparatus according to claim 8, wherein
said gate electrode and said gate line of each of said TFTs are disposed at an upper layer as compared with said semiconductor layer,
said drain line disposed at said upper layer as compared with said semiconductor layer is disposed at a more upper layer as compared with said gate electrode and said gate line with an interlayer insulation film placed therebetween,
top surface of said drain line disposed at said upper layer is coated with an insulation film except for a terminal portion of said drain line which becomes a connection portion with an external circuit, and said insulation film is provided at a more upper layer as compared with said drain line.

10. The organic electro-luminescent display apparatus according to claim 8, wherein
an interlayer insulation film is provided on said drain line for planarizing each organic electro-luminescent element, and serves as said insulation film provided on said drain line.

11. The organic electro-luminescent display apparatus according to claim 8, wherein
a bank layer for separating said electro-luminescent portions of the organic electro-luminescent elements on each pixel basis is provided on said drain line, and said bank layer is also serving as said insulation film provided on said drain line.

12. The organic electro-luminescent display apparatus according to claim 8, wherein
said drain line is disposed at a layer which is identical to that of said lower electrode of each organic electro-luminescent element, and
said drain line is formed using a material which is identical to at least part of a component that configures said lower electrode.

13. The organic electro-luminescent display apparatus according to claim 8, wherein
said drain line is disposed at a layer which is identical to that of a reflection film which is provided under said lower electrode of each organic electro-luminescent element, and
said drain line is formed using a material which is identical to at least part of a component that configures said reflection electrode.

14. The organic electro-luminescent display apparatus according to claim 8, wherein
an auxiliary line is provided and is connected to said upper electrode of each organic electro-luminescent element, said drain line is disposed at a layer which is identical to that of said auxiliary line of said upper electrode, and
said drain line is formed using a material which is identical to at least part of a component that configures said auxiliary line of said upper electrode.

15. The organic electro-luminescent display apparatus according to claim 1, wherein
film thickness of said electrode disposed at said lower layer as compared with said semiconductor layer is thinner than film thickness of said line disposed at said upper layer as compared with said semiconductor layer, and
said film thickness of said electrode is set in, desirably, a range from 20 nm to 100 nm, and being set in, more desirably, a range from 20 nm to 50 nm.

16. The organic electro-luminescent display apparatus according to claim 1, wherein
said electrode disposed at said lower layer as compared with said semiconductor layer is formed of a high-melting-point metal such as Mo, Ti, Ta, W, Nb, or Cr, or an alloy of these metals, or a multilayered film of these metals.

17. The organic electro-luminescent display apparatus according to claim 1, wherein
said electrode disposed at said lower layer as compared with said semiconductor layer is formed of an Al alloy containing at least one of Si, Cu, Pd, Ni, Ta, Ti, Zr, Hf, Sc, Y, Ce, and Nd.

18. The organic electro-luminescent display apparatus according to claim 1, wherein
said electrode disposed at said lower layer as compared with said semiconductor layer is formed of a transparent electrically-conductive oxide film, the representative of which is ITO, IZO, IGO, ITZO, IGZO, ZnO, AZO, or GZO.

19. The organic electro-luminescent display apparatus according to claim 1, wherein
said line disposed at said upper layer as compared with said semiconductor layer is formed of a low-resistance metal such as Al, Cu, or Ag, or an alloy of these metals, or a multilayered film containing these metals.

20. The organic electro-luminescent display apparatus according to claim 1, wherein
a polycrystalline-Si film or a polycrystalline-SiGe film is included in at least part of said semiconductor layer.

* * * * *